United States Patent
Hamilton et al.

(10) Patent No.: US 10,879,906 B2
(45) Date of Patent: Dec. 29, 2020

(54) QUANTUM PHASE SLIP JUNCTION BASED ADIABATIC LOGIC CIRCUITS AND APPLICATIONS OF SAME

(71) Applicant: AUBURN UNIVERSITY, Auburn, AL (US)

(72) Inventors: Michael C. Hamilton, Auburn, AL (US); Uday S. Goteti, Auburn, AL (US)

(73) Assignee: AUBURN UNIVERSITY, Auburn, AL (US)

( * ) Notice: Subject to any disclaimer, the term of this patent is extended or adjusted under 35 U.S.C. 154(b) by 0 days.

(21) Appl. No.: 16/715,661

(22) Filed: Dec. 16, 2019

(65) Prior Publication Data

US 2020/0119737 A1   Apr. 16, 2020

Related U.S. Application Data

(63) Continuation-in-part of application No. 16/000,105, filed on Jun. 5, 2018, which is a continuation of application No. 15/617,727, filed on Jun. 8, 2017, now Pat. No. 9,998,122.

(60) Provisional application No. 62/779,777, filed on Dec. 14, 2018, provisional application No. 62/779,761, filed on Dec. 14, 2018, provisional application No. 62/347,165, filed on Jun. 8, 2016.

(51) Int. Cl.
*H03K 19/195* (2006.01)
*H03K 19/21* (2006.01)
*H03K 3/38* (2006.01)

(52) U.S. Cl.
CPC ............. *H03K 19/195* (2013.01); *H03K 3/38* (2013.01); *H03K 19/21* (2013.01)

(58) Field of Classification Search
CPC ......... H03K 3/38; H03K 19/195; H03K 19/21
See application file for complete search history.

(56) References Cited

U.S. PATENT DOCUMENTS

| | | | | |
|---|---|---|---|---|
| 6,670,630 | B2 * | 12/2003 | Blais | ...................... B82Y 10/00 257/33 |
| 9,812,836 | B1 | 11/2017 | Osborn | |
| 10,447,279 | B1 * | 10/2019 | Braun | ................ H03K 19/1954 |

(Continued)

OTHER PUBLICATIONS

Holmes, D S., Ripple, A. L., and Manheimer, M A. "Energy-efficient superconducting computing power budgets and D. M. requirements," IEEE Transactions on Applied Superconductivity, vol. 23, No. 3, pp. 1 701 610-1 701 610, 2013.

(Continued)

*Primary Examiner* — Kurtis R Bahr
(74) *Attorney, Agent, or Firm* — Locke Lord LLP; Tim Tingkang Xia, Esq.

(57) ABSTRACT

A quantum charge parametron (QCP) includes a load capacitor; two quantum phase-slip junctions (QPSJs) coupled to each other through the load capacitor so as to define two charge islands, each charge island being located between the load capacitor and a respective one of the two QPSJs; at least one input voltage source coupled to the two QPSJs so that the two QPSJs, the load capacitor and the at least one input voltage source define a loop; and an excitation voltage source coupled to the two charge islands through first and second capacitors, respectively.

29 Claims, 25 Drawing Sheets

(56) References Cited

U.S. PATENT DOCUMENTS

2009/0322374 A1* 12/2009 Przybysz .............. G06N 10/00 326/5
2015/0111754 A1* 4/2015 Harris .................. G06N 10/00 505/170

OTHER PUBLICATIONS

Manheimer, Marc A. "Cryogenic computing complexity program: Phase 1 introduction." IEEE Transactions on Applied Superconductivity 25.3 (2015): 1-4.
Likharev, K. K., O. A. Mukhanov, and V. K. Semenov. "Resistive single flux quantum logic for the Josephson-junction ligital technology." Squid'85. Walter de Gruyter, Berlin, 1985.
Likharev, Konstantin K, and Vasilii K. Semenov. "RSFQ logic/memory family: A new Josephson-junction technology for sub-terahertz-clock-frequency digital systems." IEEE Transactions on Applied Superconductivity 1.1 (1991): 3-28.
Herr, Quentin P., et al. "Ultra-low-power superconductor logic." Journal of applied physics 109.10 (2011): 103903.
Mukhanov, Oleg A. "Energy-efficient single flux quantum technology." IEEE Transactions on Applied Superconductivity 21.3 (2011): 760-769.
Takeuchi, Naoki, et al. "An adiabatic quantum flux parametron as an ultra-low-power logic device." Superconductor Science and Technology 26.3 (2013): 035010.
Hosoya, Mutsumi, et al. "Quantum flux parametron: A single quantum flux device for Josephson supercomputer." IEEE Transactions on Applied Superconductivity 1.2 (1991): 77-89.
Landauer, Rolf. "Irreversibility and heat generation in the computing process." IBM journal of research and development 5.3 (1961): 183-191.
Takeuchi, N., Y. Yamanashi, and N. Yoshikawa. "Reversible logic gate using adiabatic superconducting devices." Scientific reports 4 (2014): 6354.
Semenov, Vasili K., George V. Danilov, and Dmitri V. Averin. "Classical and quantum operation modes of the reversible Josephson-junction logic circuits." IEEE Transactions on Applied Superconductivity 17.2 (2007): 455-461.
Wustmann, Waltraut, and Kevin D Osborn. "Reversible fluxon logic: Topological particles allow gates beyond the standard adiabatic limit." arXiv preprint arXiv:1711.04339 (2017).
Mooij, J. E, and Yu V. Nazarov. "Superconducting nanowires as quantum phase-slip junctions." Nature Physics 2.3 (2006): 169.
Mooij, J. E, et al. "Superconductorinsulator transition in nanowires and nanowire arrays." New Journal of Physics 173 (2015): 033006.
Astafiev, 0. V., et al. "Coherent quantum phase slip." Nature 484.7394 (2012): 355.
Webster, C. H., et al. "NBSI nanowire quantum phase-slip circuits: dc supercurrent blockade, microwave measurements, and thermal analysis." Physical Review B 87.14 (2013): 144510.
Gotet, Uday S., and Michael C. Hamilton. "Charge-based superconducting digital logic family using quantum phase-slip junctions." IEEE Transactions on Applied Superconductivity 28.4 (2018): 1-4.
Cheng, Ran, Uday S. Goteti, and Michael Hamilton. "Spiking neuron circuits using superconducting quantum phase-slip junctions." Journal of Applied Physics 124.15 (2018): 152126.
Cheng, Ran, Uday S. Goteti, and Michael C. Hamilton. "Superconducting neuromorphic computing using quantum phase-slip junctions." IEEE Transactions on Applied Superconductivity 29.5 (2019): 1-5.
Goteti, Uday Sravan, and Michael C. Hamilton. "Complementary quantum logic family using Josephson junctions and quantum phase-slip junctions" IEEE Transactions on Applied Superconductivity 29.5 (2019): 1-6.
Goteti, Uday Sravan. "Superconducting Digital Logic Families Using Quantum Phase-slip Junctions." PhD Dissertation (2019), Auburn University.
Goteti, Uday Sravan, and Michael C. Hamilton. "SPICE model implementation of quantum phase-slip junctions." Electronics Letters 51.13 (2015): 979-981.
Hioe, Willy, M. Hosoya, and E. Goto. "A new quantum flux parametron logic gate with large input margin." IEEE Transactions on Magnetics 27.2 (1991): 2765-2768.
Goto, Eiichi. "The parametron, a digital computing element which utilizes parametric oscillation." Proceedings of the IRE 47.8 (1959): 1304-1316.
Mead, Carver. "Neuromorphic electronic systems." Proceedings of the IEEE 78.10 (1990): 1629-1636.
Linares-Barranco, Bernabe, et al. "On spike-timing-dependent-plasticity, memristive devices, and building a self-learning visual cortex." Frontiers in neuroscience 5 (2011): 26.
Seo, Jae-sun, et al. "A 45nm CMOS neuromorphic chip with a scalable architecture for learning in networks of spiking neurons" Custom Integrated Circuits Conference (CICC), 2011 IEEE. IEEE, 2011.
Rajendran, Bipin, and Fabien Alibart. "Neuromorphic computing based on emerging memory technologies." IEEE Journal on Emerging and Selected Topics in Circuits and Systems 6.2 (2016): 198-211.
Sidler, Severin, et al. "Unsupervised Learning Using Phase-Change Synapses and Complementary Patterns." International Conference on Artificial Neural Networks. Springer, Cham, 2017.
Davies, Mike, et al. "Loihi: A neuromorphic manycore processor with on-chip learning." IEEE Micro 38.1 (2018): 82-99.
Bell, C., et al. "Controllable Josephson current through a pseudospin-valve structure." Applied physics letters 84.7 (2004): 1153-1155.
Ryazanov, Valery V., et al. "Magnetic Josephson junction technology for digital and memory applications." Physics Procedia 36 (2012): 35-41.
Russek, Stephen E., et al. "Stochastic single flux quantum neuromorphic computing using magnetically tunable Josephson junctions." Rebooting Computing (ICRC), IEEE International Conference on. IEEE, 2016.
Schneider, Michael L., et al. "Energy-Efficient Single-Flux-Quantum Based Neuromorphic Computing." Rebooting Computing (ICRC), 2017 IEEE International Conference on. IEEE, 2017.
Schneider, Michael L, et al. "Ultralow power artificial synapses using nanotextured magnetic Josephson junctions." Science advances 4.1 (2018): e1701329.
Shainline, Jeffrey M., et al. "Superconducting optoelectronic circuits for neuromorphic computing." Physical Review Applied 7.3 (2017): 034013.
Izhikevich, Eugene M. "Which model to use for cortical spiking neurons?." IEEE transactions on neural networks 15.5 (2004): 1063-1070.
Jeong, Doo Seok, and Cheol Seong Hwang. "Nonvolatile Memory Materials for Neuromorphic Intelligent Machines." Advanced Materials (2018): 1704729.

* cited by examiner

QUANTUM PHASE SLIP JUNCTION BASED ADIABATIC LOGIC CIRCUITS AND APPLICATIONS OF SAME

CROSS-REFERENCE TO RELATED PATENT APPLICATIONS

This application claims priority to and the benefit of, pursuant to 35 U.S.C. § 119(e), U.S. Provisional Patent Application Serial Nos. 62/779,761 and 62/779,777, both filed Dec. 14, 2018, which are incorporated herein in their entireties by reference.

This application also is a continuation-in-part application of U.S. patent application Ser. No. 16/000,105, filed Jun. 5, 2018, which itself is a continuation application of U.S. patent application Serial of U.S. patent application Ser. No. 15/617,727, filed Jun. 8, 2017, now U.S. Pat. No. 9,998,122, which claims priority to and the benefit of U.S. Provisional Patent Application Ser. No. 62/347,165, filed Jun. 8, 2016, which are incorporated herein in their entireties by reference.

FIELD OF THE INVENTION

The present invention relates generally to superconducting quantum logic, and more particularly, to an adiabatic quantum charge parametron and corresponding circuits based on quantum phase slip junctions—adiabatic operation for reversible computing, and applications of the same.

BACKGROUND OF THE INVENTION

The background description provided herein is for the purpose of generally presenting the context of the present invention. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions. Work of the presently named inventors, to the extent it is described in the background of the invention section, as well as aspects of the description that may not otherwise qualify as prior art at the time of filing, are neither expressly nor impliedly admitted as prior art against the present invention.

Superconducting computing is gaining interest as an energy-efficient alternative to CMOS computing for high-performance computing, particularly in petascale and exascale computing. These computing technologies are predominantly based on Josephson junctions (JJs) and rapid single-flux quantum (RSFQ) logic. While these circuits consume significant energy in the form of static-power dissipation, variations of this technology have been introduced to mitigate this problem in the forms of reciprocal quantum logic (RQL), energy-efficient single-flux quantum logic (eSFQ), etc. Therefore, the typical energy consumption per switching event in these circuits is $I_C \Phi_0$, which is on the order of $10^{18}$ J, where $I_C$ is the critical current of the Josephson junction and $\Phi_0$ is the single-flux quantum. It has been demonstrated that, by adiabatically switching between states in a quantum flux parametron (QFP) circuit, the switching energy dissipation can be reduced to significantly below $I_C \Phi_0$ and to the order of $k_B T$, where $k_B$ is the Boltzmann's constant and T is the operating temperature of the circuit. These adiabatic quantum flux parametron (AQFP) circuits also provide double well potential gate that enables the possibility of reversible computing. Additionally, potentially reversible Josephson junction-based logic circuits have been proposed.

Quantum phase slip junctions (QPSJs) are duals of JJs based on charge-flux duality. QPSJ based structures may also serve as a potential circuit element in applications in superconducting electronics and quantum information processing with the possibility of even lower energy per operation compared to circuits comprised of JJs. However, practical implementation of a QPSJ with proper DC and RF operation has been relatively challenging. There has been no report of an adiabatic quantum charge parametron (QCP) and corresponding circuits based on QPSJs.

Therefore, a heretofore unaddressed need exists in the art to address the aforementioned deficiencies and inadequacies.

SUMMARY OF THE INVENTION

In one aspect, the present invention relates to a quantum charge parametron (QCP). In one embodiment, the QCP includes a load capacitor; two quantum phase-slip junctions (QPSJs) coupled to each other through the load capacitor so as to define two charge islands, each charge island being located between the load capacitor and a respective one of the two QPSJs; at least one input voltage source coupled to the two QPSJs so that the two QPSJs, the load capacitor and the at least one input voltage source define a loop; and an excitation voltage source coupled to the two charge islands.

In one embodiment, the QCP further includes a first capacitor and a second capacitor, each of the first and second capacitors coupled between the excitation voltage source and a respective one of the two charge islands. The potential energy of the quantum charge parametron is then determined by $$U_{QCP} = E_S \left[ \frac{(q_{ex} - q_-)^2}{\beta_L} + \frac{(q_{in} - q_+)^2}{\beta_L + 2\beta_q} - 2\cos(q_-)\cos(q_+) \right]$$

wherein $$\beta_L = 2C_1 V_C \left( \frac{2\pi}{2e} \right),$$

$$\beta_q = 2C_q V_C \left( \frac{2\pi}{2e} \right),$$

$$q_+ = \frac{q_1 + q_2}{2},$$

$$q_- = \frac{q_1 - q_2}{2},$$

wherein $q_{in}$ is a normalized input charge, $q_{ex}$ is a normalized excitation charge, $E_s$ is a phase-slip energy of either of the two QPSJs, $V_C$ is a critical voltage of either of the two QPSJs, $C_q$ is a capacitance of the load capacitor, $C_1$ is a capacitance of the first capacitor, and $q_1$ and $q_2$ are the charges at nodes 1 and 2 normalized to $2\pi/2e$.

In one embodiment, the capacitances $C_1$, $C_2$ and $C_q$ are adjusted to enable the QCP to operate at a switching energy in the order of thermal energy $k_B T$ or lower at a given temperature, when a predetermined excitation voltage source frequency is chosen.

In one embodiment, the potential energy as a function of the normalized output charge gout is characterized with a double potential well that is formed corresponding to two current directions, thereby defining two logic states of the QCP, where an energy barrier between the potential wells determines energy consumption of switching from one logic state to another logic state.

In one embodiment, the capacitance $C_q$ of the load capacitor is adjusted to make the parameter $\beta_L=1$, such that the energy barrier is lowered to zero, thereby enabling adiabatic switching between the two logic states.

In one embodiment, switching between the two logic states depends on a polarity of an input voltage from the at least one input voltage source, and the input voltage is in the order of $0.1V_C$ or lower to perform switching operation.

In one embodiment, for each charge island, when a quantized charge of a Cooper electron pair tunnels across the respective QPSJ that defines said charge island, the quantized charge of the Cooper electron pair is stored in said charge island, otherwise no quantized charge of the Cooper electron pair is stored in said charge island, where the presence and absence of the quantized charge in said charge island form two logic states of a basic logic element.

In one embodiment, the quantized charge is obtained by switching either of the two QPSJs to produce a current pulse, corresponding to the charge of a Cooper electron pair, when excited by an input voltage from the at least one input voltage source and an excitation voltage from the excitation voltage source.

In one embodiment, two ground, or lowest energy level, states are represented by the presence of the quantized charge at either of the two charge islands.

In one embodiment, switching of the quantized charge between the two charge islands is triggered by the polarity of a DC input voltage from the at least one input voltage source, with positive polarity corresponding to the quantized charge at one of the two charge islands and negative polarity corresponding to the quantized charge at the other charge island, where said switching occurs when the critical voltage of one of the two QPSJs is exceeded by a potential difference developed across said QPSJ due to the input and excitation voltage sources.

In one embodiment, depending on the input voltage polarity, the input and excitation voltage sources act together at one of the two charge islands and against each other at the other charge island.

In one embodiment, at least one input voltage source comprises first, second and third input voltage sources coupled to the two QPSJs in series. In one embodiment, by fixing one of the first, second and third input voltages in one polarity and changing the polarity of the other input voltages, an universal logic gate of NOR or NAND is operably implemented in the form of a majority gate operation.

In another aspect of the invention, the QCP includes two QPSJs; two charge islands coupled to each other through a load capacitor and isolated from the rest of the quantum charge parametron through the two QPSJs; at least one input voltage source coupled to the two QPSJs in series; and an excitation voltage source coupled to the two islands.

In one embodiment, the excitation voltage source is coupled to the two islands through first and second capacitors.

In one embodiment, for each charge island, when a quantized charge of a Cooper electron pair tunnels across the respective QPSJ that defines said charge island, the quantized charge of the Cooper electron pair is stored in said charge island, otherwise no quantized charge of the Cooper electron pair is stored in said charge island, where the presence and absence of the quantized charge in said charge island form two logic states of a basic logic element.

In one embodiment, the quantized charge is obtained by switching either of the two QPSJs to produce a current pulse, corresponding to the charge of a Cooper electron pair, when excited by an input voltage from the at least one input voltage source and an excitation voltage from the excitation voltage source.

In one embodiment, two ground, or lowest energy level, states are represented by the presence of the quantized charge at either of the two charge islands.

In one embodiment, switching of the quantized charge between the two charge islands is triggered by the polarity of a DC input voltage from the at least one input voltage source, with positive polarity corresponding to the quantized charge at one of the two charge islands and negative polarity corresponding to the quantized charge at the other charge island, where said switching occurs when the critical voltage of one of the two QPSJs is exceeded by a potential difference developed across said QPSJ due to the input and excitation voltage sources.

In one embodiment, depending on the input voltage polarity, the input and excitation voltage sources act together at one of the two charge islands and against each other at the other charge island.

In one embodiment, at least one input voltage source comprises first, second and third input voltage sources coupled to the two QPSJs in series. In one embodiment, by fixing one of the first, second and third input voltages in one polarity and changing the polarity of the other input voltages, an universal logic gate of NOR or NAND is operably implemented in the form of a majority gate operation.

In yet another aspect, the invention relates to a superconducting logic cell comprising at least one quantum charge parametron disclosed above.

In one aspect, the invention relates to a circuitry. The circuitry in one embodiment comprises a plurality of QCPs coupled to each other, each QCP having an input and an output, wherein an output signal from the output of one QCP is used as an input signal to the input of another QCP to drive the another QCP.

In one embodiment, each QCP comprises two QPSJs; two charge islands coupled to each other through a load capacitor and isolated from the rest of said QCP through the two QPSJs; and an excitation voltage source coupled to the two islands, wherein the input is connected between the two QPSJs so that the input, the two QPSJs and the load capacitor define a loop, and the output is read across the load capacitor.

In one embodiment, each QCP further comprises a first capacitor and a second capacitor, each of the first and second capacitors coupled between the excitation voltage source and a respective one of the two charge islands.

In one embodiment, the input of the first QCP of the plurality of QCPs comprises at least one input voltage source.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the present invention and, together with the written description, serve to explain the principles of the invention. Wherever possible, the same reference numbers are used throughout the drawings to refer to the same or like elements of an embodiment.

FIG. 6A: Excitation voltage $V_{ex}$. FIG. 6B: Current at node 1. FIG. 6C: Current at node 2.

FIG. 19A: =200 μA. FIG. 19B: $I_c$=300 μA.

FIG. 21A: $I_c$=10 μA. FIG. 21B: $I_c$=50 μA. FIG. 21C: $I_c$=350 μA. FIG. 21D: $I_c$=400 μA.

DETAILED DESCRIPTION OF THE INVENTION

Figure 1B:
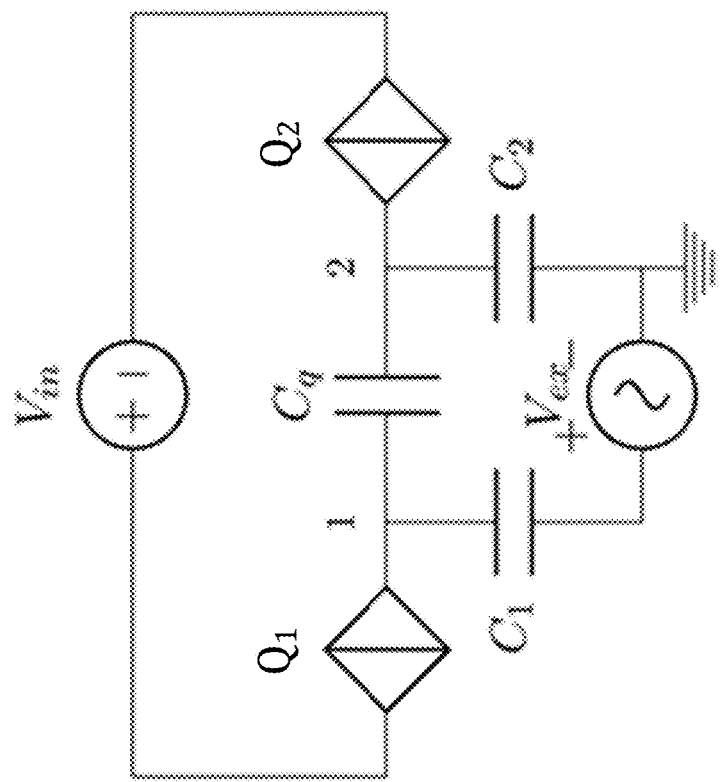
FIG. 1B shows a quantum charge parametron (QCP) circuit based on quantum phase-slip junctions (QPSJs) according to embodiments of the invention.

The present invention will now be described more fully hereinafter with reference to the accompanying drawings, in which exemplary embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting and/or capital letters has no influence on the scope and meaning of a term; the scope and meaning of a term are the same, in the same context, whether or not it is highlighted and/or in capital letters. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only and in no way limits the scope and meaning of the invention or of any exemplified term. Likewise, the invention is not limited to various embodiments given in this specification.

The terminology used herein is for the purpose of describing particular embodiments only and is not intended to be limiting of the invention. As used herein, the singular forms "a," "an," and "the" are intended to include the plural forms as well, unless the context clearly indicates otherwise.

It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "adjacent" to another feature may have portions that overlap or underlie the adjacent feature.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below can be termed a second element, component, region, layer or section without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation shown in the figures. For example, if the device in one of the figures is turned over, elements described as being on the "lower" side of other elements would then be oriented on the "upper" sides of the other elements. The exemplary term "lower" can, therefore, encompass both an orientation of lower and upper, depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprise(s)" and/or "comprising," or "include(s)" and/or "including" or "has (have)" and/or "having" or "contain(s)" and/or "containing" when used in this specification specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around," "about," "substantially" or "approximately" shall generally mean within 20 percent, preferably within 10 percent, and more preferably within 5 percent of a given value or range. Numerical quantities given herein are approximate, meaning that the terms "around," "about," "substantially" or "approximately" can be inferred if not expressly stated.

As used in this specification, the phrase "at least one of A, B, and C" should be construed to mean a logical (A or B or C), using a non-exclusive logical OR. As used herein, the term "and/or" includes any and all combinations of one or more of the associated listed items.

The description below is merely illustrative in nature and is in no way intended to limit the invention, its application, or uses. The broad teachings of the invention can be implemented in a variety of forms. Therefore, while this invention includes particular examples, the true scope of the invention should not be so limited since other modifications will become apparent upon a study of the drawings, the specification, and the following claims. For purposes of clarity, the same reference numbers will be used in the drawings to identify similar elements. It should be understood that one or more steps within a method may be executed in different order (or concurrently) without altering the principles of the invention.

In this invention, we disclose a quantum charge parametron (QCP) circuit using quantum phase-slip junctions (QPSJs), which is also referred hereinafter as a "QPSJ based parametron" or "QPSJ based parametron circuit". The QCP circuit is analogous to the QFP circuit, but implements quantized charge 2e of a Cooper electron pair on superconducting islands formed by two QPSJs, instead of flux quantum in superconducting loops broken by JJs. QPSJs are duals of JJs based on charge-flux duality, where a quantum tunneling of flux across a superconducting nanowire suppresses its superconductivity. This event can be characterized by a Coulomb blockade with a critical voltage across the wire. We have previously introduced quantized charge based digital logic circuits using QPSJs comparable to RSFQ circuits and neuromorphic circuits using similar principles, as well as logic circuits that implement both flux quanta with JJs and charge quanta with QPSJs coupled to each other. The operation of these circuits was demonstrated using WRSPICE by implementing a SPICE model developed for QPSJs.

According to this invention, by applying various QPSJ based logic circuit principles, the QCP circuits demonstrate universal logic implementation that establishes an alternative to adiabatic QFP circuits. Furthermore, energy consumption of the QCP circuits is on the order of thermal energy $k_BT$ at a temperature of 2 K, when appropriate circuit parameters are used. Compared to the QFP, the QCP circuits have faster logic operation and lower energy consumption, which provides advantages in adiabatic logic operation and reversible computing.

In one aspect of the invention, the QCP includes a load capacitor, two quantum phase-slip junctions (QPSJs) coupled to each other through the load capacitor so as to define two charge islands, at least one input voltage source coupled to the two QPSJs so that the two QPSJs, the load capacitor and the at least one input voltage source define a loop, and an excitation voltage source coupled to the two charge islands.

As discussed below, a potential energy of the QCP is determined by Eqn. (1). The potential energy as a function of the normalized output charge $q_{out}$ is characterized with a double potential well that is formed corresponding to two current directions, thereby defining two logic states of the QCP. The energy barrier between the potential wells determines energy consumption of switching from one logic state to another logic state.

In certain embodiments, when the capacitance of the load capacitor is adjusted to make the parameter $\beta_L=1$, the energy barrier is lowered to zero, which enables adiabatic switching between the two logic states. In addition, switching between the two logic states depends on a polarity of an input voltage from the at least one input voltage source, and the input voltage is in the order of $0.1V_C$ or lower, in order to perform switching operation.

In certain embodiments, the QCP further includes a first capacitor and a second capacitor, each of the first and second capacitors coupled between the excitation voltage source and a respective one of the two charge islands. The potential energy of the quantum charge parametron is then determined by Eqn. (3) below.

In certain embodiments, by adjusting the capacitances of the first, second and load capacitors, the QCP can operate at a switching energy in the order of thermal energy $k_BT$ or lower at a given temperature, when a predetermined excitation voltage source frequency is chosen.

In certain embodiments, for each charge island, when a quantized charge of a Cooper electron pair tunnels across the respective QPSJ that defines said charge island, the quantized charge of the Cooper electron pair is stored in said charge island, otherwise no quantized charge of the Cooper electron pair is stored in said charge island. The presence and absence of the quantized charge in said charge island form two logic states of a basic logic element.

In certain embodiments, the quantized charge is obtained by switching either of the two QPSJs to produce a current pulse, corresponding to the charge of a Cooper electron pair, when excited by an input voltage from the at least one input voltage source and an excitation voltage from the excitation voltage source.

In certain embodiments, two ground, or lowest energy level, states are represented by the presence of the quantized charge at either of the two charge islands.

In certain embodiments, switching of the quantized charge between the two charge islands is triggered by the polarity of a DC input voltage from the at least one input voltage source, with positive polarity corresponding to the quantized charge at one of the two charge islands and negative polarity corresponding to the quantized charge at the other charge island, where said switching occurs when the critical voltage of one of the two QPSJs is exceeded by a potential difference developed across said QPSJ due to the input and excitation voltage sources.

In certain embodiments, depending on the input voltage polarity, the input and excitation voltage sources act together at one of the two charge islands and against each other at the other charge island.

In certain embodiments, at least one input voltage source comprises first, second and third input voltage sources coupled to the two QPSJs in series. By fixing one of the first, second and third input voltages in one polarity and changing the polarity of the other input voltages, an universal logic gate of NOR or NAND is operably implemented in the form of a majority gate operation.

In another aspect of the invention, the QCP includes two QPSJs; two charge islands coupled to each other through a load capacitor and isolated from the rest of the quantum charge parametron through the two QPSJs; at least one input voltage source coupled to the two QPSJs in series; and an excitation voltage source coupled to the two islands.

In certain embodiments, the excitation voltage source is coupled to the two islands through first and second capacitors.

Similarly, by adjusting the capacitances of the first, second and load capacitors, the QCP can operate at a switching energy in the order of thermal energy $k_BT$ or lower at a given temperature, with a faster switching time. In addition, an universal logic gate of NOR or NAND can also be implemented in the form of a majority gate operation, by selection of the polarities and amplitudes of input voltages of at least one input voltage source.

In yet another aspect, the invention relates to a superconducting logic cell comprising at least one quantum charge parametron disclosed above.

In a further aspect, the invention relates to a circuitry. The circuitry comprises a plurality of QCPs coupled to each other, each QCP having an input and an output, wherein an output signal from the output of one QCP is used as an input signal to the input of another QCP to drive the another QCP.

In certain embodiments, each QCP comprises two QPSJs; two charge islands coupled to each other through a load capacitor and isolated from the rest of said QCP through the two QPSJs; and an excitation voltage source coupled to the two islands, wherein the input is connected between the two QPSJs so that the input, the two QPSJs and the load capacitor define a loop, and the output is read across the load capacitor.

In certain embodiments, each QCP further comprises a first capacitor and a second capacitor, each of the first and second capacitors coupled between the excitation voltage source and a respective one of the two charge islands.

In certain embodiments, the input of the first QCP of the plurality of QCPs comprises at least one input voltage source.

To further illustrate the principles of the invention and their practical application, certain exemplary embodiments of the invention are described below with reference to the accompanying drawings.

Figure 1A:
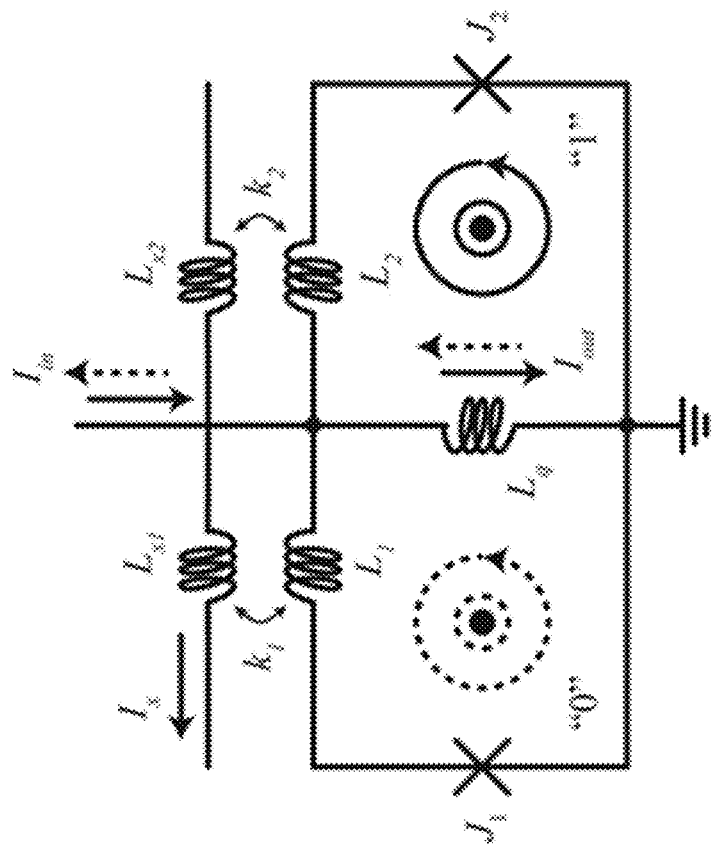
FIG. 1A shows a quantum flux parametron (QFP) circuit based on Josephson junctions (JJs).

QCP Circuit:

In certain embodiments, the QCP circuit is designed based on QPSJs, as shown in FIG. 1B, which represents a similar dual potential gate structure to that of a QFP circuit based on JJs, as shown in FIG. 1A. The QCP circuit is symmetrical and has two charge islands coupled to each other through the load capacitor $C_q$ and isolated from the rest of the circuit through QPSJs ($Q_1$ and $Q_2$). The two islands are shown as nodes 1 and 2 in the QCP circuit. A voltage input $V_{in}$ is connected to both the QPSJs and an excitation voltage source $V_{ex}$ is coupled to the islands through capacitors $C_1$ and $C_2$.

Both the QCP and QFP circuits are duals to each other based on the charge-flux duality. In the QCP circuit, the T-junction formed by inductors $L_1$, $L_2$ and $L_q$ is replaced by the dual π-junction formed by capacitors $C_1$, $C_2$ and $C_q$. Similar to the excitation current source is coupled to inductors $L_1$ and $L_2$ in the QFP circuit, an excitation voltage source is coupled to capacitors $C_1$ and $C_2$. The loops trapping flux formed by $J_1$, $L_1$, $L_q$ and $J_2$, $L_2$, $L_q$ are replaced by the islands trapping charge formed by $Q_1$, $C_1$, $C_q$ and $Q_2$, $C_2$, $C_q$. Finally, the input current signal ($I_{in}$) parallel to both the loops is replaced by the input voltage signal ($V_{in}$) in series to both the islands.

In the JJ parametron circuit, the excitation current source is responsible in switching either of the JJs and creating a flux in a loop. The JJ that is being switched depends on the polarity of the input signal. The input signal is typically very small, i.e., of the order of 0.1 $I_C$, while the output current is higher than $I_C$, where $I_C$ is the critical current of both the identical junctions. Similar to this JJ parametron circuit operation, the excitation voltage source in the QPSJ parametron circuit is responsible for generating charge tunneling on to either of the charge islands on $C_1$ and $C_2$, while the input voltage signal polarity determines the current direction. The two logic bits '0' and '1' in both the JJ and QPSJ parametron circuits are determined by the output current direction. In the JJ parametron circuit, the output current is the current through the inductor $L_q$, while in the QPSJ parametron circuit, the output current is the current in the loop formed by $Q_1$, $Q_2$ and $C_q$.

It is shown that, in both the JJ and QPSJ parametron circuits, it is possible to choose the parameters such as inductances/capacitances, excitation source magnitudes and frequencies, such that the switching between these logic states consumes energy less than the thermal energy limit $k_B T$ at the operating temperature. This adiabatic operation enables reversible computing, therefore theoretically reducing the energy consumption for computing operation to zero.

Potential Energy of QCP Circuit:

To illustrate adiabatic logic operation of the QCP circuit, the potential energy of the QCP circuit is simplified by Eqn. (1), where the load capacitors $C_1$ and $C_2$ of FIG. 1B are considered as short.

$$U_{QCP} = E_S \left[ \frac{(q_{out} - q_{in})^2}{\beta_L} - 2\cos(q_{out})\cos(q_{ex}) \right] \quad (1)$$

where $$\beta_L = 2C_q V_C \left( \frac{2\pi}{2e} \right) \quad (2)$$

$q_{out}$ is the normalized output charge, $q_{in}$ is the normalized input charge, $q_{ex}$ is the normalized excitation charge and $E_s$ is the phase-slip energy. Accordingly, the parameters that determine the adiabatic mode of circuit operation are the load capacitance $C_q$ and the excitation and input charge magnitude. The potential energy normalized to the phase-slip energy can be plotted as a function of $\beta_L$ and $q_{ex}$.

Figure 2:
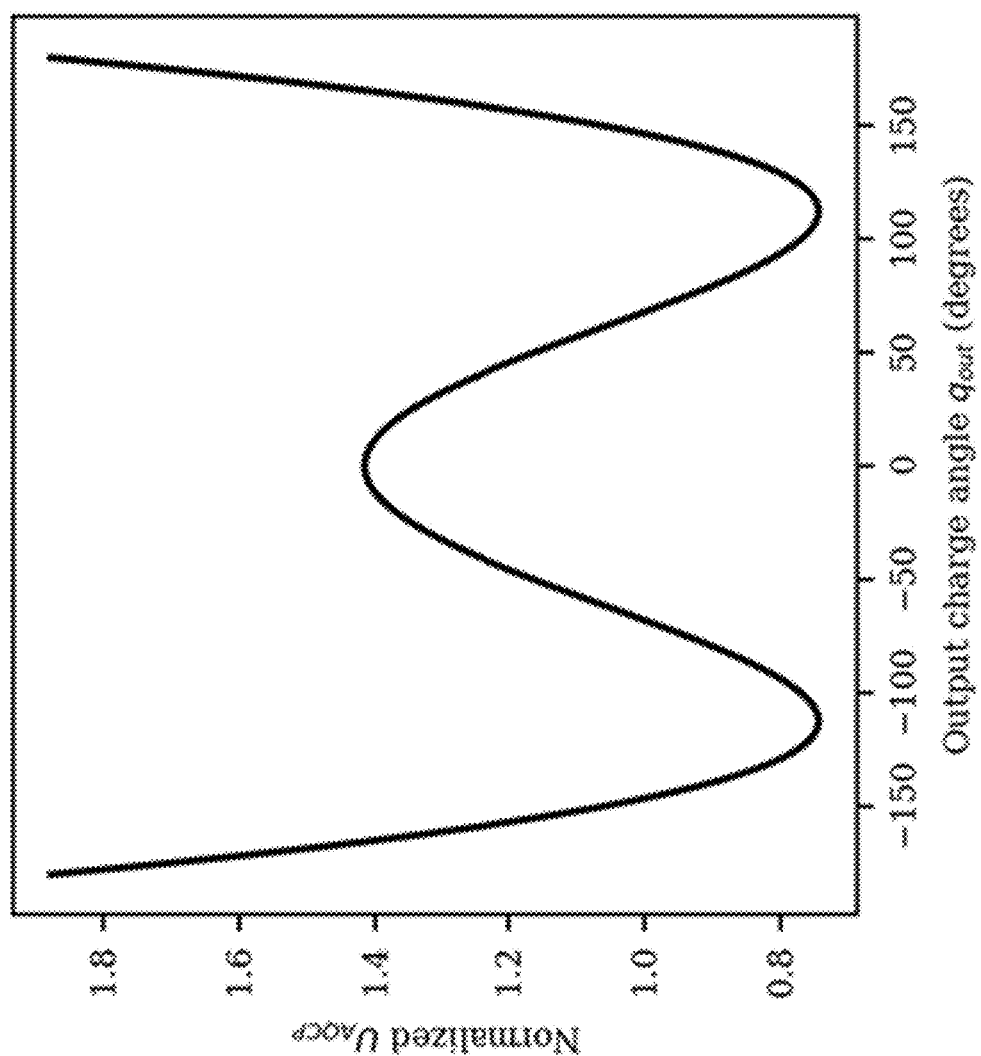
FIG. 2 shows a potential energy of a QPSJ based parametron as a function of normalized output charge, according to embodiments of the invention.

In one embodiment, FIG. 2 illustrates the potential energy of the QCP circuit as a function of the normalized output charge $q_{out}$, where a double potential well is formed corresponding to the two current directions, i.e., the two logic states of the QCP circuit. The energy barrier between the potential wells determines the cost (energy consumption) of switching from one logic state to another logic state. The QCP circuit is in either of the two lowest energy stable states while no switching is performed.

Figures 3A, 3B:
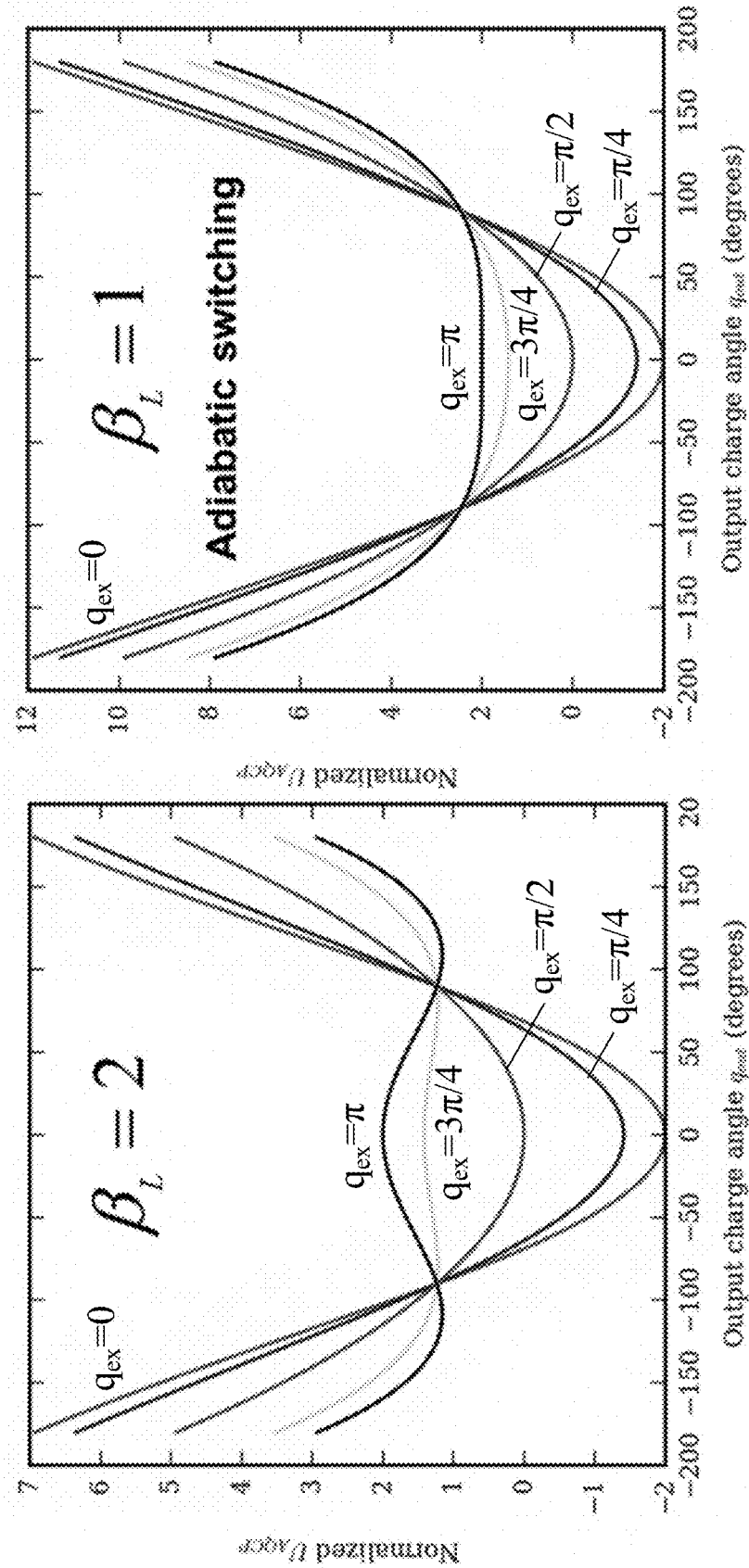
FIGS. 3A-3B show potential energies of a QPSJ based parametron as a function of the parameter $\beta_L$ and normalized excitation charge illustrating adiabatic switching, according to embodiments of the invention.
Figure 4A:
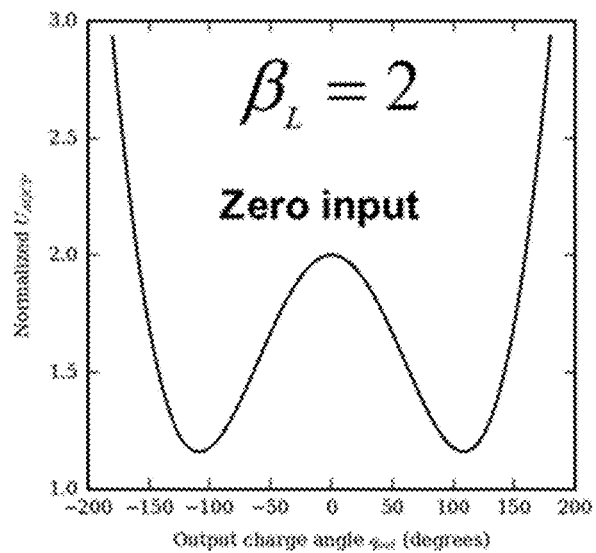
FIGS. 4A-4D show potential energies of the QPSJ based parametron illustrating the effects of variation in the parameter $\beta_L$ and the input voltage, according to embodiments of the invention. $\beta_L=1$ corresponds to adiabatic switching.
Figure 4B:
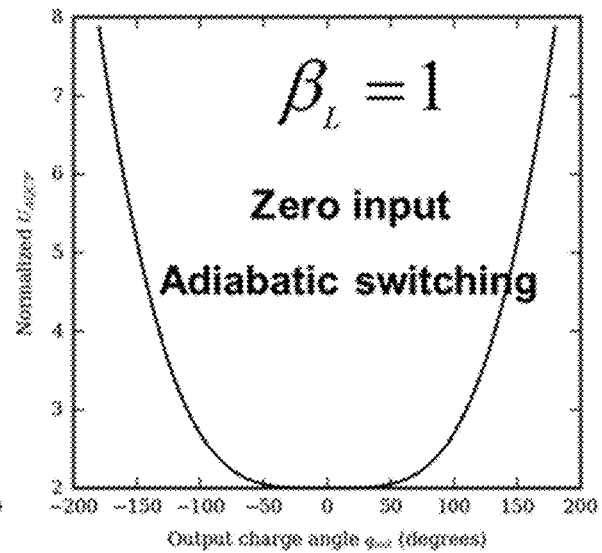
Figure 4C:
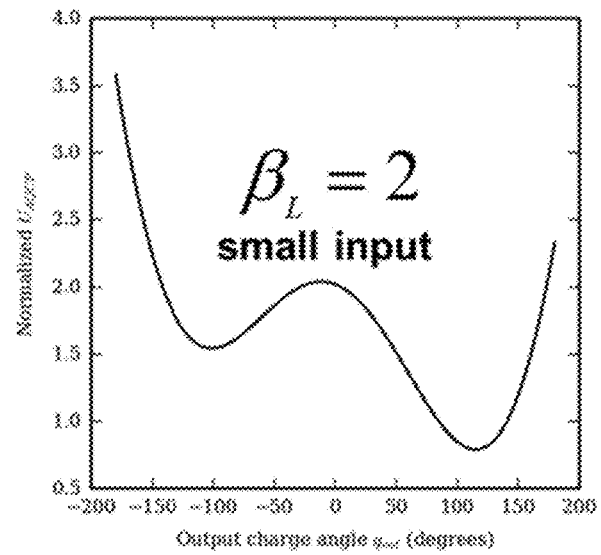
Figure 4D:
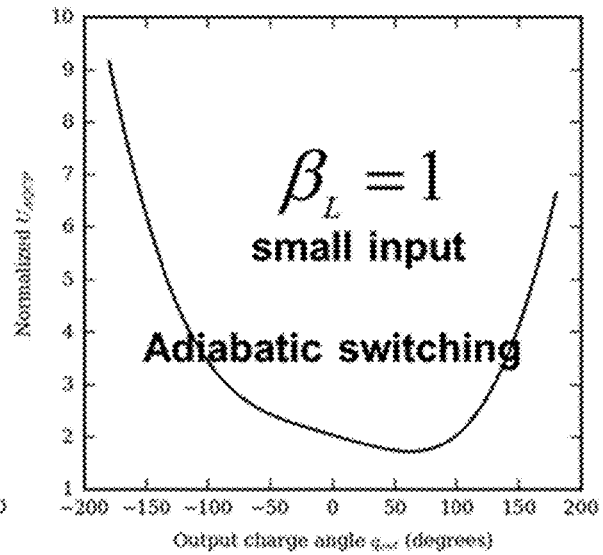

With the appropriate choice of $C_q$ to make the parameter $\beta_L = 1$, the energy barrier can be brought down to zero, thereby, enabling adiabatic switching, as illustrated in FIG. 3B, where the potential energy of the QPSJ based parametron as a function of excitation and parameter $\beta_L$ is shown.

Switching between the logic states depends on the polarity of the input voltage. The potential energy with the input voltage is shown in FIGS. 4A-4D. A very small input voltage (of the order of $0.1 V_C$, where $V_C$ is the critical voltage of either of QPSJs) is necessary to perform switching operation. The input voltage creates an energy difference in both the logic states such that the lower energy state becomes more stable.

Figure 5:
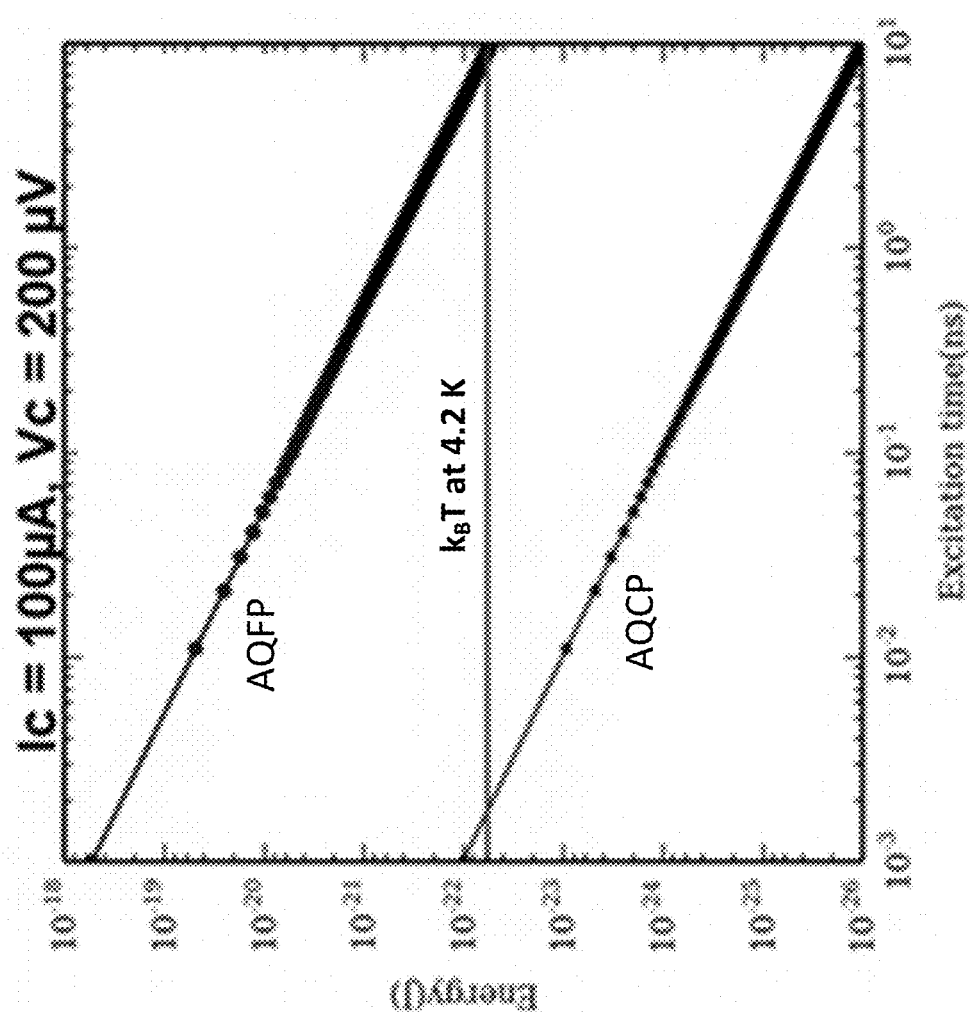
FIG. 5 shows energy consumption versus operating speed comparison of JJ and QPSJ based parametrons according to embodiments of the invention. Thermal energy at 4.2 K is shown. Operation below thermal energy is for adiabatic switching.

The comparison of the energy consumption versus operating speed of the JJ and QPSJ based parametrons is shown in FIG. 5. Thermal energy at 4.2 K is shown. Operation below the thermal energy is for adiabatic switching. For the adiabatic operation, The QPSJ parametron can be operated at higher operating speeds. Furthermore, the QPSJ parametron consumes lower energy compared to the JJ parametron.

When the capacitors $C_1$ and $C_2$ are included in the potential energy equation, as parameters that can be chosen to obtain the adiabatic operation, the potential energy equation is given by Eqn. (3).

$$U_{QCP} = E_S \left[ \frac{(q_{ex} - q_-)^2}{\beta_L} + \frac{(q_{in} - q_+)^2}{\beta_L + 2\beta_q} - 2\cos(q_-)\cos(q_+) \right] \quad (3)$$

where $$\beta_L = 2C_1 V_C \left( \frac{2\pi}{2e} \right) \quad (4)$$

$$\beta_q = 2C_q V_C \left( \frac{2\pi}{2e} \right) \quad (5)$$

$$q_+ = \frac{q_1 + q_2}{2} \quad (6)$$

$$q_- = \frac{q_1 - q_2}{2} \quad (7)$$

The potential energy of the QCP circuit represented by Eqn. (3) is a dual representation of the potential energy in a QFP circuit, with charge variables replacing the flux terms and capacitive terms replacing inductive terms. $E_S$ is the phase-slip energy of the two identical QPSJs. The parameters $\beta_L$ and $\beta_q$, and therefore the capacitances of $C_1$, $C_2$ and $C_q$ can be adjusted to enable the circuit to operate at a switching energy below $k_B T$ when an appropriate excitation source frequency or lower is chosen.

Figure 6A:
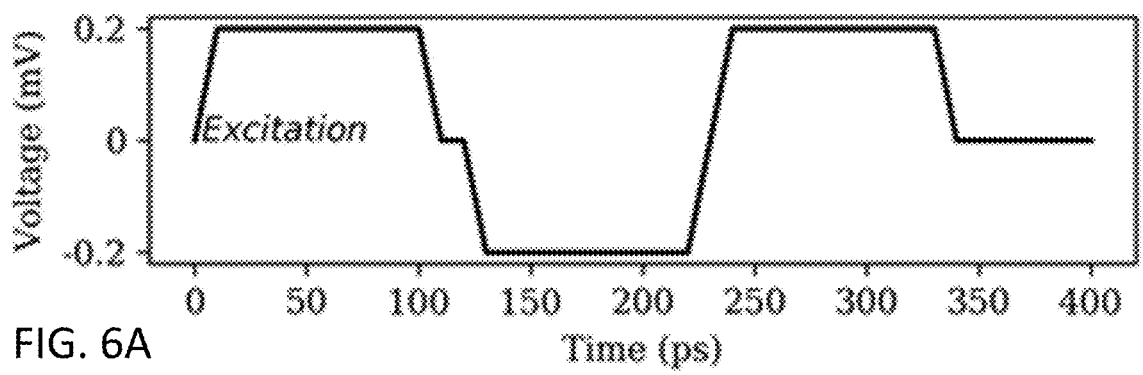
FIGS. 6A-6C show simulation results of the QPSJ based parametron circuit shown in FIG. 1B according to embodiments of the invention.
Figure 6B:
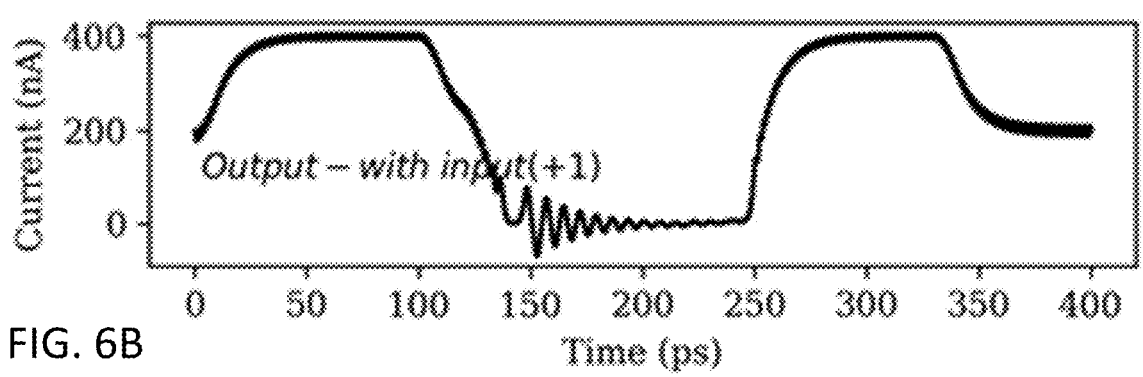

The two degenerate ground, or lowest energy level, states are represented by the presence of quantized charges at either of the islands at nodes 1 or 2. The charges are obtained by switching either of the QPSJs $Q_1$ or $Q_2$ to produce a current pulse, corresponding to a charge of the Cooper electron pair, when excited by the input voltage and the excitation source. The details of switching dynamics of the dual islands are similar to that of a single charge island that is discussed in the context of charge island operation. In this circuit, the switching of charge 2e between islands 1 and 2 is triggered by the DC input voltage polarity, with positive polarity corresponding to charge at node 1 and negative polarity corresponding to charge at node 2. The switching happens when the critical voltage of one of the QPSJs is exceeded by the potential difference developed across the QPSJ due to the voltage sources $V_{in}$ and $V_{ex}$. Depending on the input voltage polarity, the two sources act together at one of the islands and against each other at the other island. The simulation results of the QCP circuit shown in FIG. 1B are shown in FIGS. 6A-6B to demonstrate this mechanism.

Figure 11:
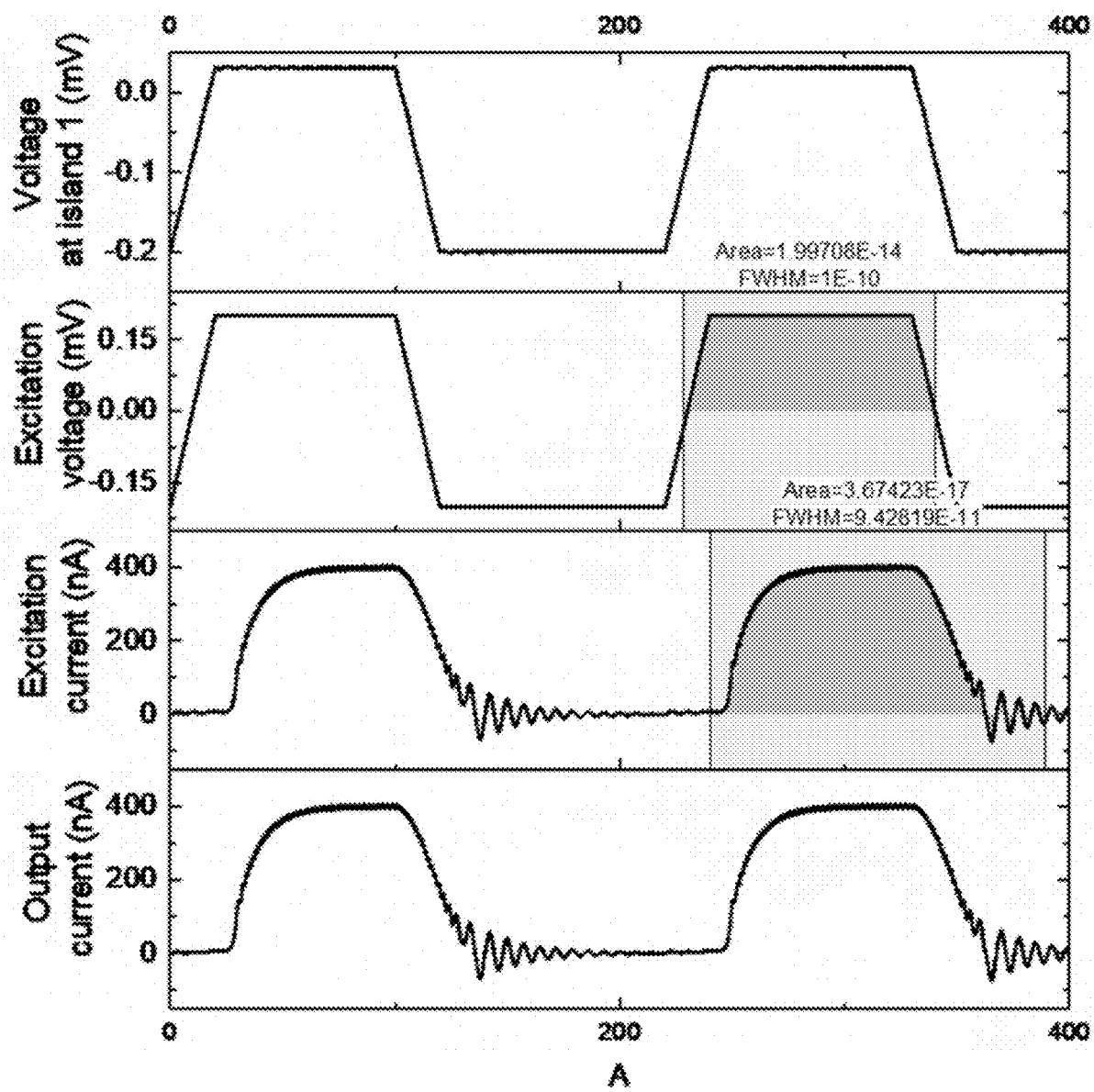
FIG. 11 shows areas under the curve for voltage and current waveforms corresponding to a single switching cycle used to calculate energy dissipation per bit, according to embodiments of the invention.
Figure 12:
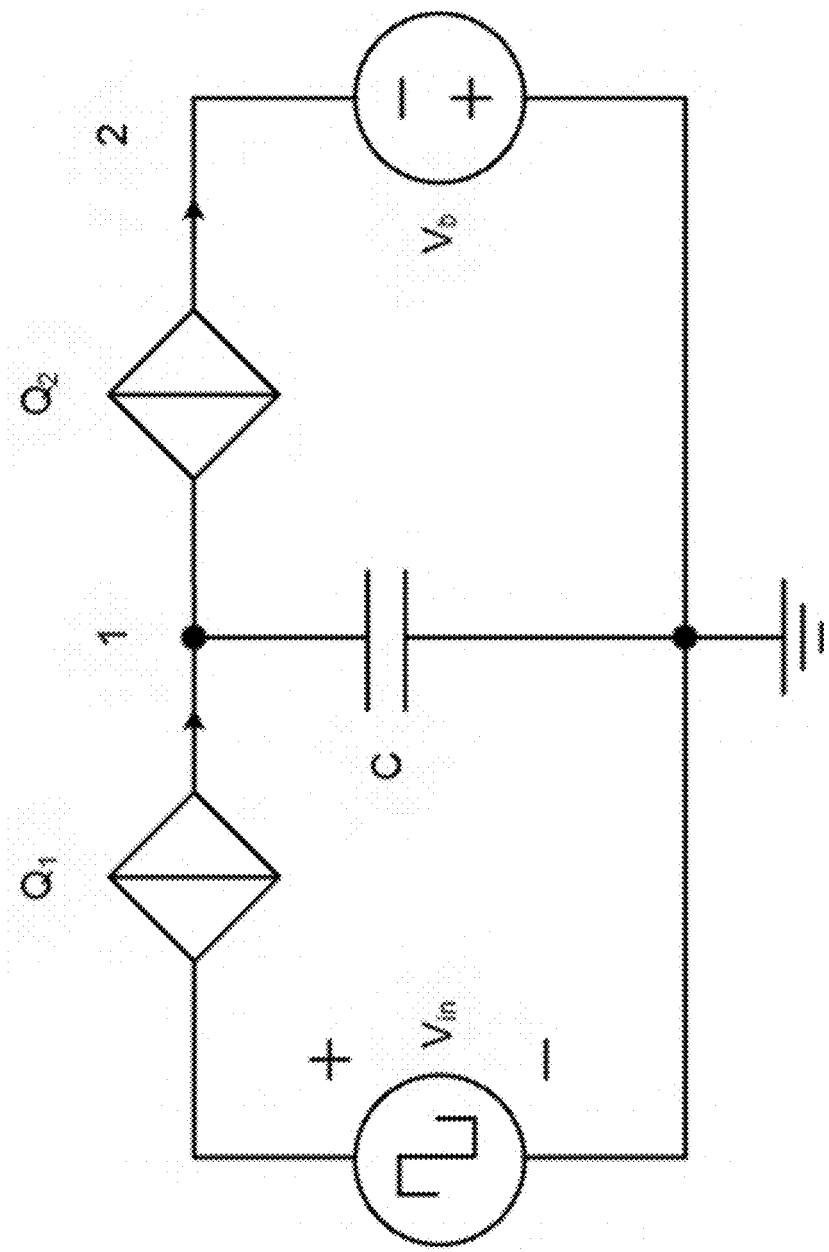
FIG. 12 shows a QPSJ circuit comprised of two QPSJs and one capacitor, according to embodiments of the invention.

Adiabatic Operation of QCP Circuit:

In order to ensure that the QCP circuit shown in FIG. 1B has the switching energy dissipation in the order of thermal energy $k_BT$ or lower at a given temperature, the QCP circuit must be operated adiabatically. Therefore, the circuit parameters, along with the operating conditions such as the rise/fall time of the excitation voltage pulse and the input voltage magnitude, must be chosen appropriately. The potential energy of the circuit switching dynamics shown in Eqn. (3) corresponds to the double well potential shown in FIG. 2, representing the two ground, or lowest energy level, states for presence of charge 2e at node 1 or node 2 of FIG. 1B. A simplified illustration of adiabatic switching can be demonstrated by showing the variation of capacitances $C_1$ and $C_2$. This corresponds to a change in $\beta_L$. FIG. 4 shows two different cases of $\beta_L$, where $\beta_L=1$ corresponds to adiabatic switching when the phase of the excitation $q_{ex}=\pi$. In this case, a small input enables switching between the states by inducing a slope in the potential energy. The typical voltage input needed is $0.1V_C$, where $V_C$ is the critical voltage of the QPSJs in the circuit. To demonstrate the typical energy dissipation during adiabatic operation of the circuit, the QCP circuit is designed to operate in adiabatic mode in simulation. The results are shown in FIG. 11, and the corresponding switching energy dissipation is calculated as shown in Eqn. (8).

Figure 7:
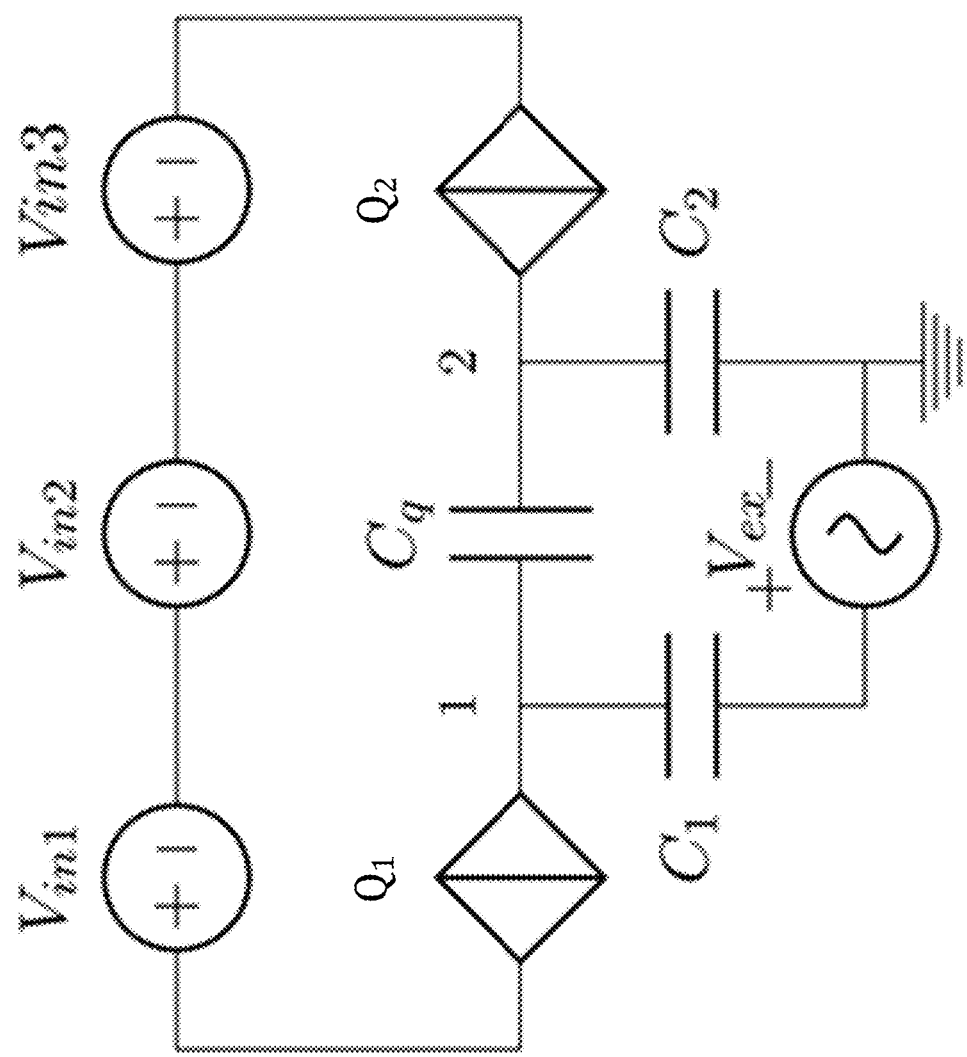
FIG. 7 shows a 3-input Majority gate using a QPSJ based parametron according to embodiments of the invention.
Figure 8A:
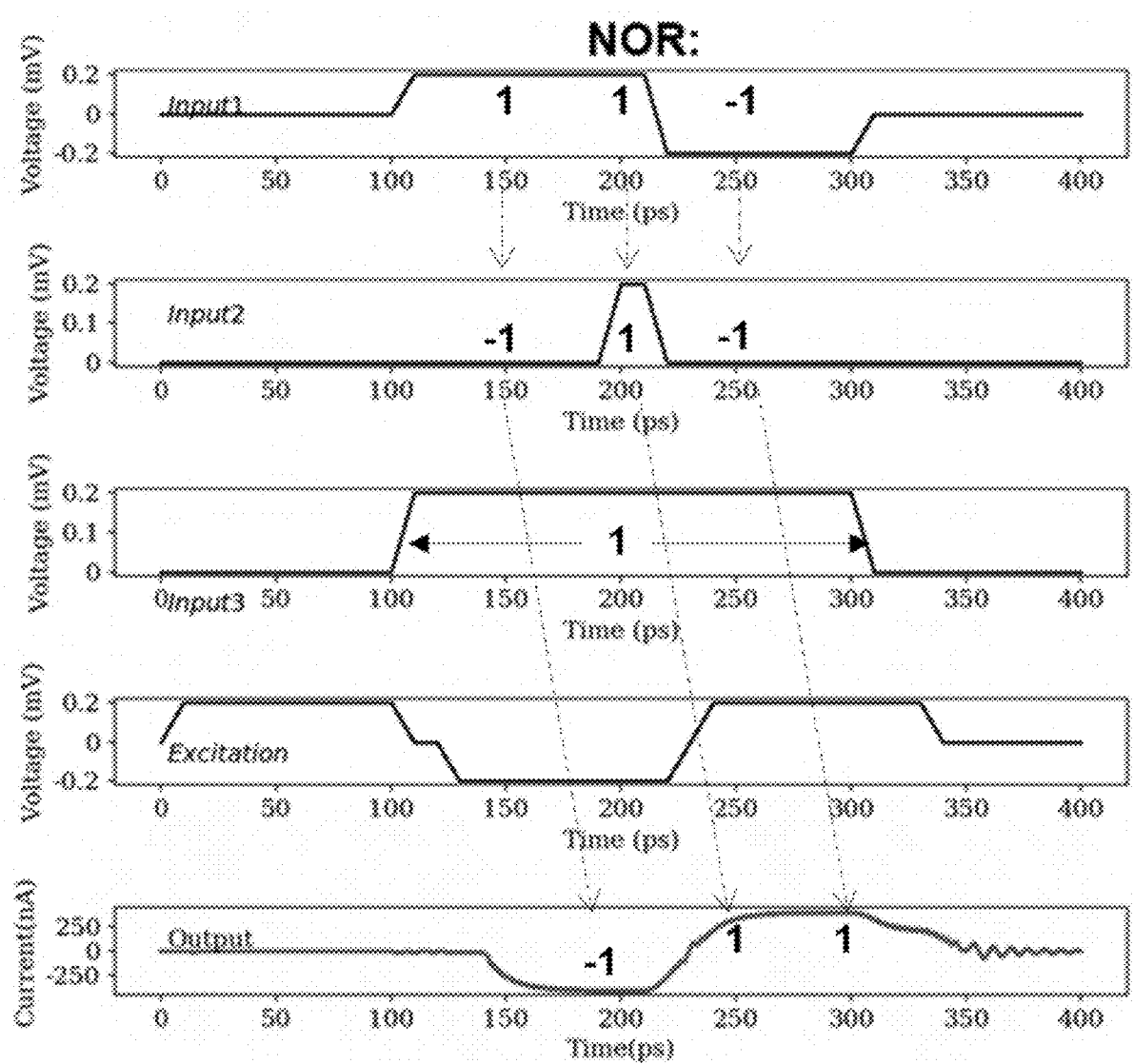
FIGS. 8A-8B show respectively NOR and NAND operations using a QPSJ-based Majority gate according to embodiments of the invention.
Figure 8B:
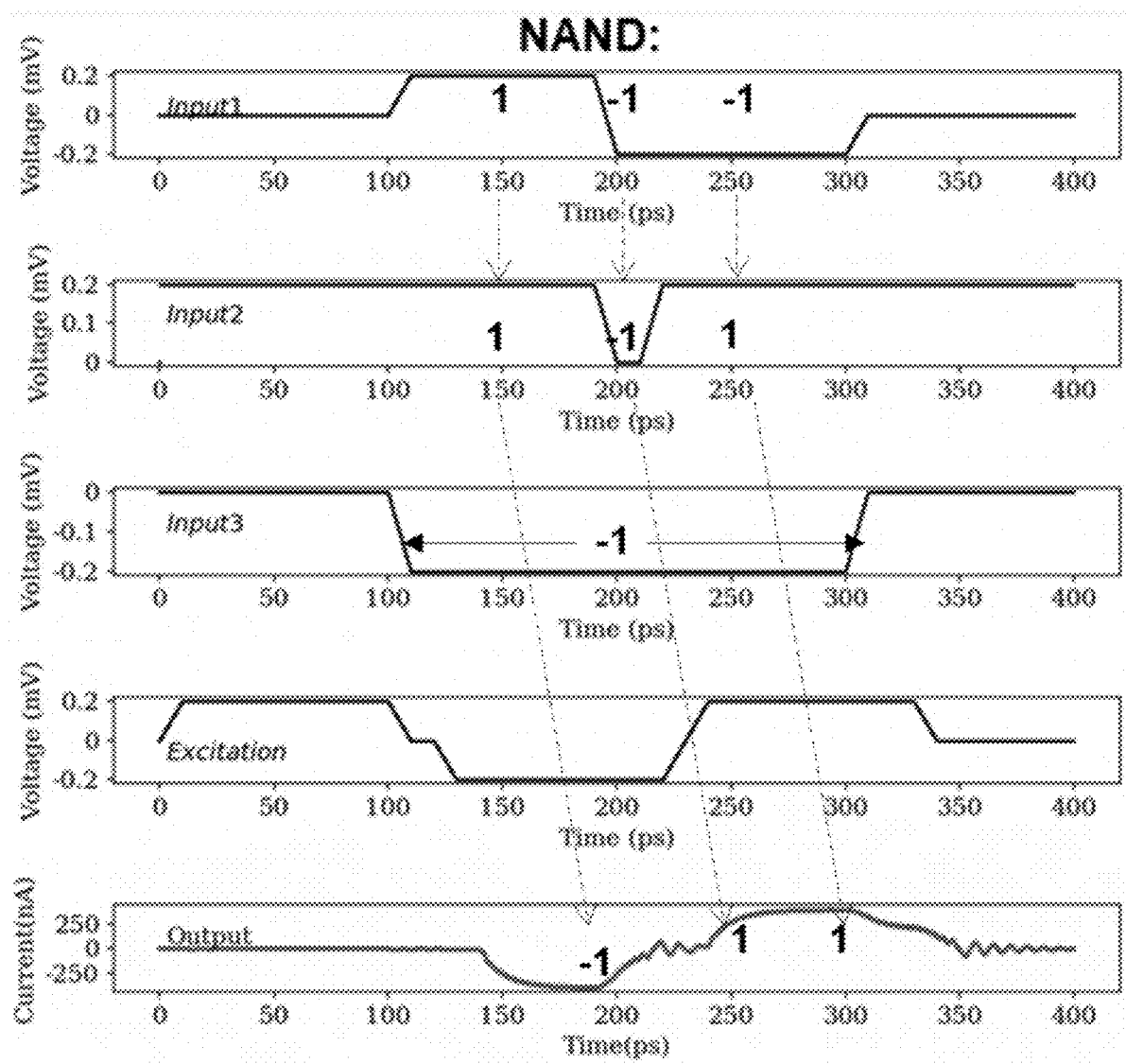

Logic Gate Implementation:

According to the invention, the QCP circuit allows universal logic gate implementation in the form of a majority gate operation similar to that of QFP circuits. In one embodiment, a 3-input inverse majority gate implementation is illustrated. The schematic of the logic gate is shown in FIG. 7. The QCP circuit has three voltage inputs in place of a single input in a QCP gate. The three voltage sources represent output voltages from three different QCP logic cells. The presence of charge 2e on island at node 1 represents logical bit '1' and the presence of charge 2e on island at node 2 represents logical bit '0'. The output can be read as the voltage across the load capacitor $C_q$ with positive voltage representing '1' and negative voltage representing '0'. By forcing one of the three inputs to '1', we can obtain a two input NOR gate and by forcing one of the three inputs to '0', we can achieve NAND gate operation. The simulation results corresponding to these two logic gates are shown in FIGS. 8A and 8B, respectively. NOR and NAND operations together comprise the universal logic implementation using QCP gates, although other reversible logic operations can be achieved by using similar implementation as that of reversible QFP gate.

Circuit Designs and Simulations:

In one embodiment, the QCP circuit shown in FIG. 1B is simulated with the following parameters. Each of QPSJs $Q_1$ and $Q_2$ is characterized with a critical voltage $V_C=400$ μV, a resistance $R_n=1$ kΩ, and an inductance L=10 nH. Capacitances $C_1=0.228$ fF, $C_2=0.228$ fF, Cq=0.5 fF. Input voltage $V_{in}=\pm200$ μV, and the magnitude of excitation voltage $V_{ex}=200$ μV. The operation time, 250 ps period.

Figure 6C:
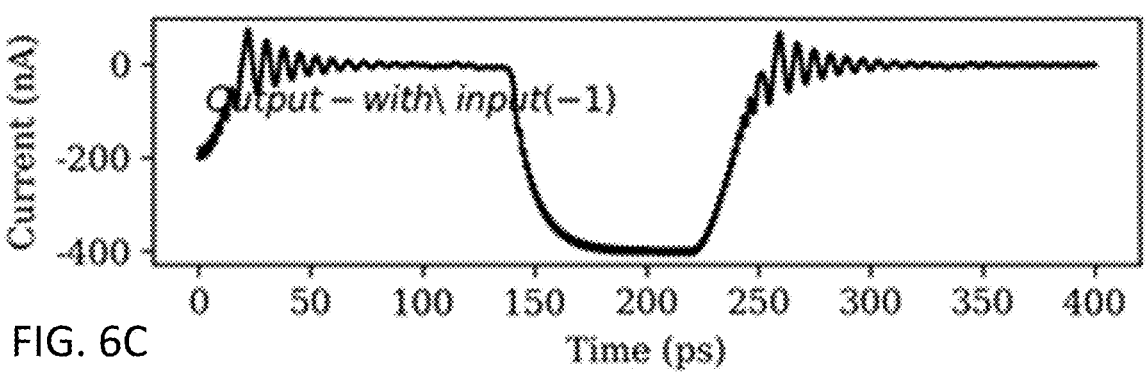

The simulation results of the a QPSJ based parametron cell are shown in FIGS. 6A-6C. Input (+1) implies $V_{in}=+200$ μV and input (−1) implies $V_{in}=-200$ μV. Input is a DC voltage in this simulation. When the input is (+1), the corresponding output current is positive. The current pulses are only seen during the positive cycle of excitation, with zero current when the excitation is negative. When the input is (−1), the corresponding output current is negative. This cell can be configured to form a Majority logic gate. Majority logic gate is a reversible gate, therefore satisfying conditions suitable for reversible computing. These conditions include logical and physical reciprocity, i.e., the input logic state can be achieved when the output is injected into the input/output of an identical Majority gate.

The Majority gate schematic is shown in FIG. 7. It is identical to the basic QPSJ based parametron but has three voltage input signals in series. NOR and NAND operations of the Majority gate simulations are shown in FIGS. 8A-8B. Tables 1 and 2 show the truth tables for the operation.

TABLE 1

A truth table for NOR gate using Majority gate.

|  | In1 | In2 | In3 | Out |
|---|---|---|---|---|
| NOR: | 1 | 1 | 1 | −1 |
|  | 1 | −1 | 1 | −1 |
|  | −1 | 1 | 1 | −1 |
|  | −1 | −1 | 1 | 1 |

TABLE 2

A truth table for NAND gate using Majority gate.

|  | In1 | In2 | In3 | Out |
|---|---|---|---|---|
| NAND: | 1 | 1 | −1 | −1 |
|  | 1 | −1 | −1 | 1 |
|  | −1 | 1 | −1 | 1 |
|  | −1 | −1 | −1 | 1 |

Figure 9:
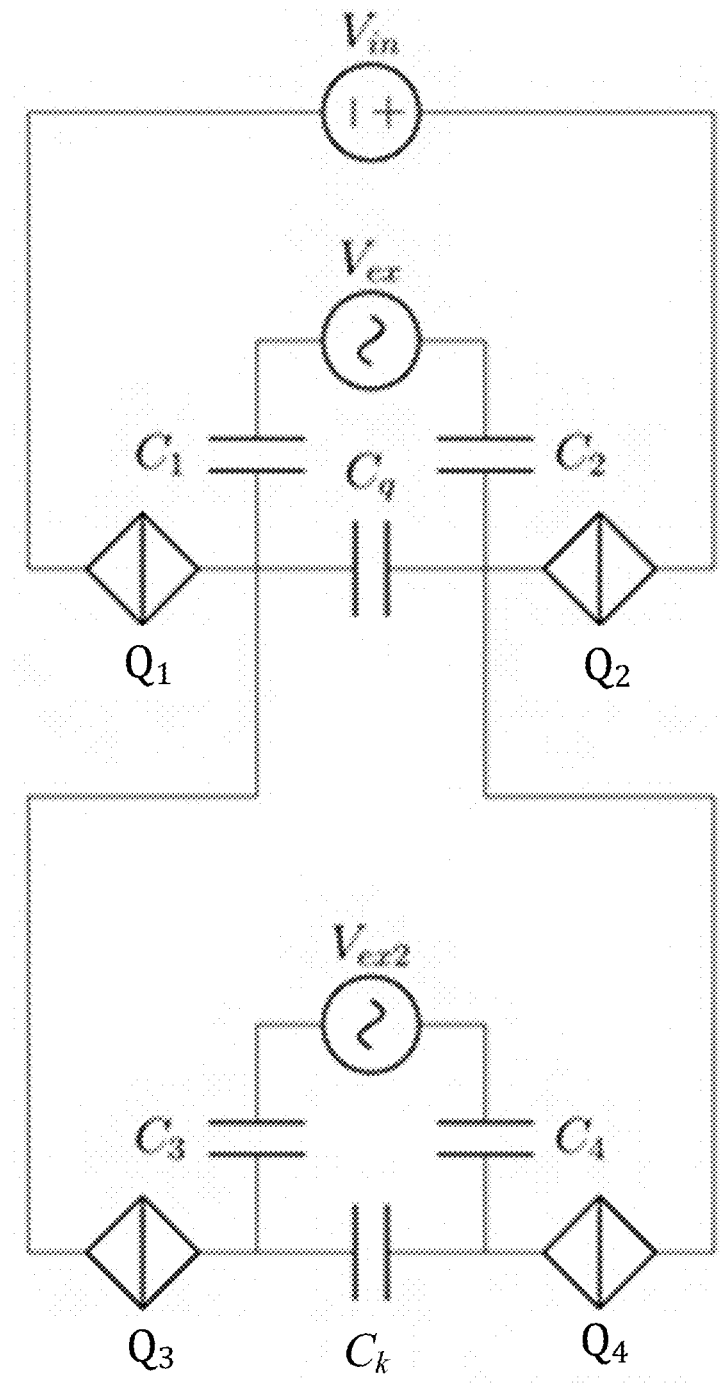
FIG. 9 shows a parametron circuit having two different quantum charge parametron cells coupled to each other through the load capacitor $C_q$, according to embodiments of the invention. The capacitor $C_q$ has the similar effect on the parametron circuit to that of the input voltage $V_{in}$.
Figure 10A:
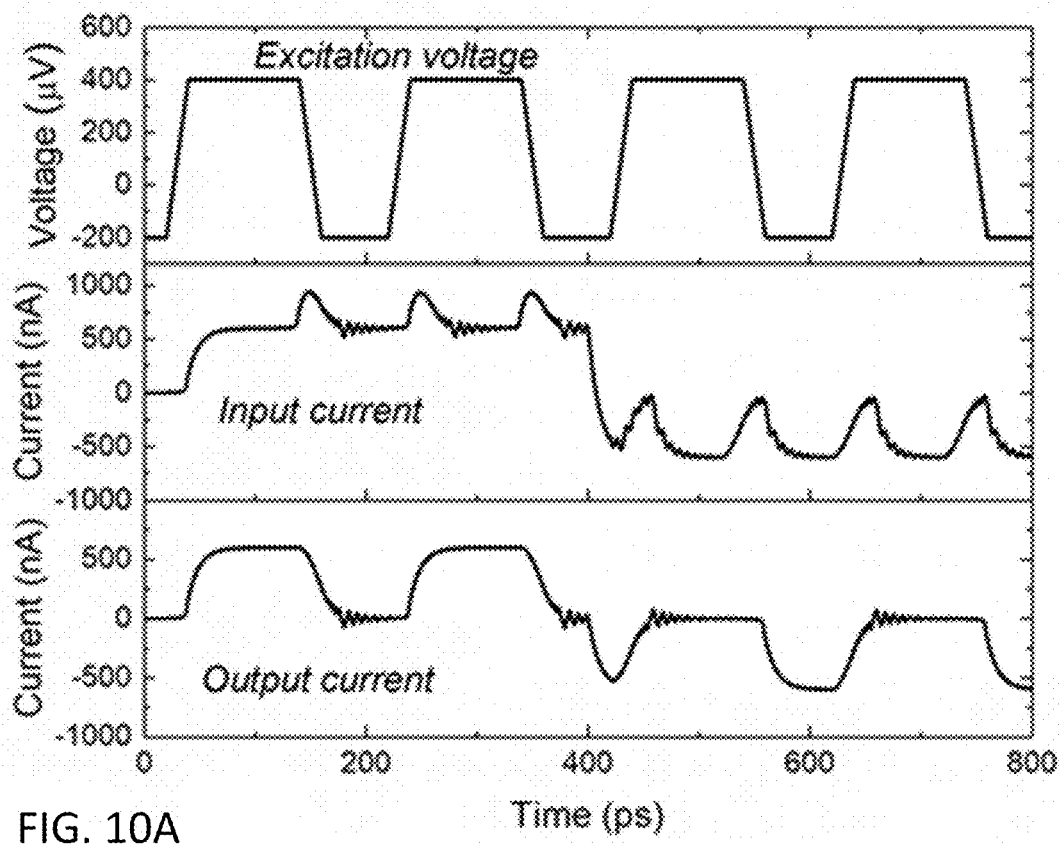
FIG. 10A shows excitation voltage source, input current and output current of the charge parametron cell formed by $Q_1$, $Q_2$, $C_1$, $C_2$ and $C_q$ shown in FIG. 9, according to embodiments of the invention.

Interaction/Coupling Between Parametron Circuits:

The output signal from one quantum charge parametron can be used to drive another quantum charge parametron cell on the input through the load capacitor $C_q$. In one exemplary embodiment, two different quantum charge parametron cells coupled to each other through the load capacitor $C_q$ is shown in FIG. 9. The capacitor $C_q$ has similar effect on the parametron circuit as that of the input voltage $V_{in}$. The circuit shown in FIG. 9 demonstrates this operation with the corresponding simulation results shown in FIGS. 10A-10B. FIG. 10A shows excitation source, input current and output current of the charge parametron cell formed by $Q_1$, $Q_2$, $C_1$, $C_2$ and $C_q$ of FIG. 9. FIG. 10A shows excitation source, input current and output current of the charge parametron cell formed by $Q_3$, $Q_4$, $C_3$, $C_4$ and $C_k$ of FIG. 9.

In this circuit, the initial charge parametron cell is formed by $Q_1$, $Q_2$, $C_1$, $C_2$ and $C_q$ with the excitation source $V_{ex}$ and input signal $V_{in}$. The simulation results shown in FIG. 10A suggest operation consistent with charge parametron operation shown in FIGS. 6A-6C and 8A-8B. The input signal is setup such that it is high (i.e., a small positive voltage) for the first 400 ps and low (i.e. a small negative voltage) between about 400 ps to about 800 ps instead of a constant DC source as in FIGS. 6A-6C to be able to demonstrate all the operations in the same plot.

Figure 10B:
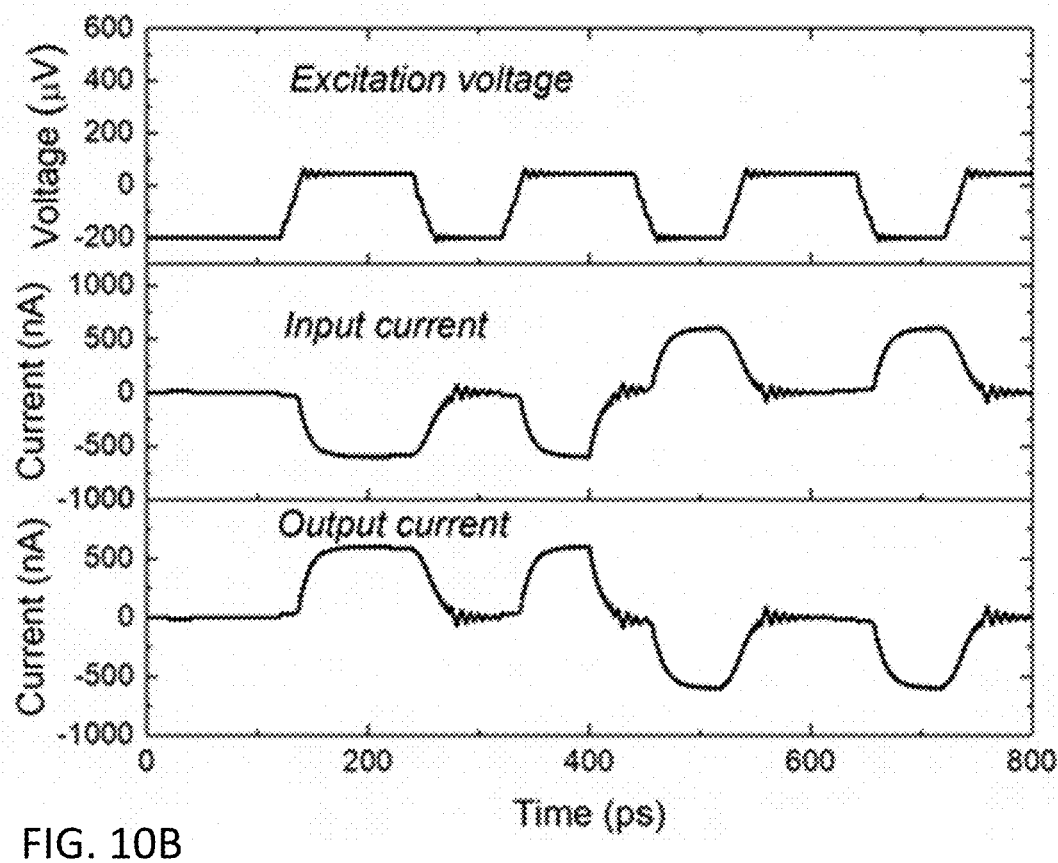
FIG. 10B shows excitation voltage source, input current and output current of the charge parametron cell formed by $Q_3$, $Q_4$, $C_3$, $C_4$ and $C_k$ shown in FIG. 9, according to embodiments of the invention.

The output current is similar to the input current while the excitation/clock signal is high. This demonstrates that the presence of quantized charge 2e on either node of the load capacitor $C_q$ is dependent on the input signal polarity. Therefore, the voltage across the load capacitor $C_q$ can be used as an input signal to an adjacent parametron cell formed by $Q_3$, $Q_4$, $C_3$, $C_4$ and $C_k$ with the excitation source $V_{ex2}$ and input signal from capacitor $C_q$. A different excitation voltage is used with a delay/phase shift between the two excitation voltages. This is similar to the clock implementation in an adiabatic quantum flux parametron, to determine the signal direction and to prevent the effect of operation of the second parametron on the first. FIG. 10B shows the operation of parametron cell formed by $Q_3$, $Q_4$, $C_3$, $C_4$ and $C_k$. The small voltage signal across the load capacitor $C_q$ is sufficient to generate similar output current as that of the parametron circuit of $Q_1$, $Q_2$, $C_1$, $C_2$ and $C_q$.

Practically, further optimizing the circuit operation by tuning the circuit parameters to achieve adiabatic mode of operation may be needed. This involves tuning the parameters $\beta_L$ and $\beta_q$ of Eqns. (4) and (5), respectively. For adiabatic operations of the QCP circuit, the switching energy must be below the thermal energy $k_B T$, i.e., about $4 \times 10^{-23}$ J. The bit energy of the current circuit can be estimated from simulations. FIG. 11. shows an area under the curve for voltage and current waveforms corresponding to single switching cycle used to calculate energy per bit. A single cycle of the excitation voltage and current are integrated, and the energy is calculated below:

$$E_{QCP} = \frac{(1.99 \times 10^{-14})(3.67 \times 10^{-17})}{100 \times 10^{-12}} = 7.303 \times 10^{-21} \text{J per bit} \quad (8)$$

The calculated energy per bit is for the clock at a frequency of 10 GHz, without any optimization to achieve adiabatic operation. The switching energy will be further reduced by tuning junction parameters, the $\beta_L$ and $\beta_q$ parameters and the clock speed.

In some embodiments, the operation of a single cell of a charge parametron circuit family and its corresponding logic circuits is disclosed. In other embodiments, the operation of several single cells together can also be implemented, where a plurality of QCP circuits is coupled to each other to implement logic gates. In certain embodiments, the output from a single QCP logic cell can be used to drive the adjacent QCP logic cell.

In sum, the invention discloses, among other things, a new family of superconducting digital electronic circuits, that is compatible for reversible computing, using QPSJs. The duality relationship between Josephson tunneling phenomenon and quantum phase-slip phenomenon is used to design a quantum charge parametron circuit based on a QFP circuit. Circuit operation and universal logic implementation of a QCP circuit are demonstrated using SPICE simulations. The switching energy estimation of the adiabatic QCP circuit is in the order of a few aJs at a clock frequency of 10 GHz, based on simulation results. However, the circuit can be further optimized by tuning the parameters $\beta_L$ and $\beta_q$, along with the critical voltage $V_C$ of the QPSJs to achieve a significant advantage over AQFP circuits. A comparison of switching energy for adiabatic QCP circuits to that of adiabatic QFP circuits, based on phase-slip energy estimation of QPSJs using a model developed by Mooij et al. is presented in FIG. 5. This indicates that it is possible to achieve a switching energy of up to three orders of magnitude lower than the adiabatic QFP circuits, which also enables the operation of adiabatic QCP circuits at higher clock frequencies in adiabatic operation. However, the operating temperatures of QPSJs may be lower than 4.2 K.

Furthermore, among other things, QPSJs may find applications in the variety of fields. For example, as disclosed below, QPSJs can be utilized to perform superconducting neuromorphic computing.

Brain-inspired neuromorphic computing is a non-von Neumann architecture that aims at emulating biological neurons to solve complex problems such as decision making and object recognition with low power consumption compared with traditional computer systems. Neuromorphic hardware has seen remarkable improvement due to advanced, highly-scaled CMOS technology and emerging memory devices during recent years. However, a bottleneck arises when scaling CMOS technology as its energy efficiency is several orders of magnitude lower than the human brain. Meanwhile, superconducting materials and circuits that exhibit ultra-low power consumption are potential candidates for brain-inspired computation. Recently, with the discovery of magnetic Josephson junctions (MJJs), a research group has proved the learning function of a superconducting neuromorphic system consisting of JJs and MJJs, which improved the speed to the order of picoseconds/ spike and energy consumption to the order of aJ/spike. Comparable achievements have been realized by a hybrid platform with semiconducting few-photon light-emitting diodes and superconducting nanowire single-photon detectors. As disclosed below, the quantized-charge circuit element based on a superconducting island formed using quantum phase-slip junctions (QPSJs) can also emulate spiking neuron circuits in terms of tonic spiking and tonic bursting. The superconducting device mimics neurons in a more power efficient and faster way. The firing speed can reach several picoseconds/spike while the energy consumption is only several zJ/spike.

Figure 13:
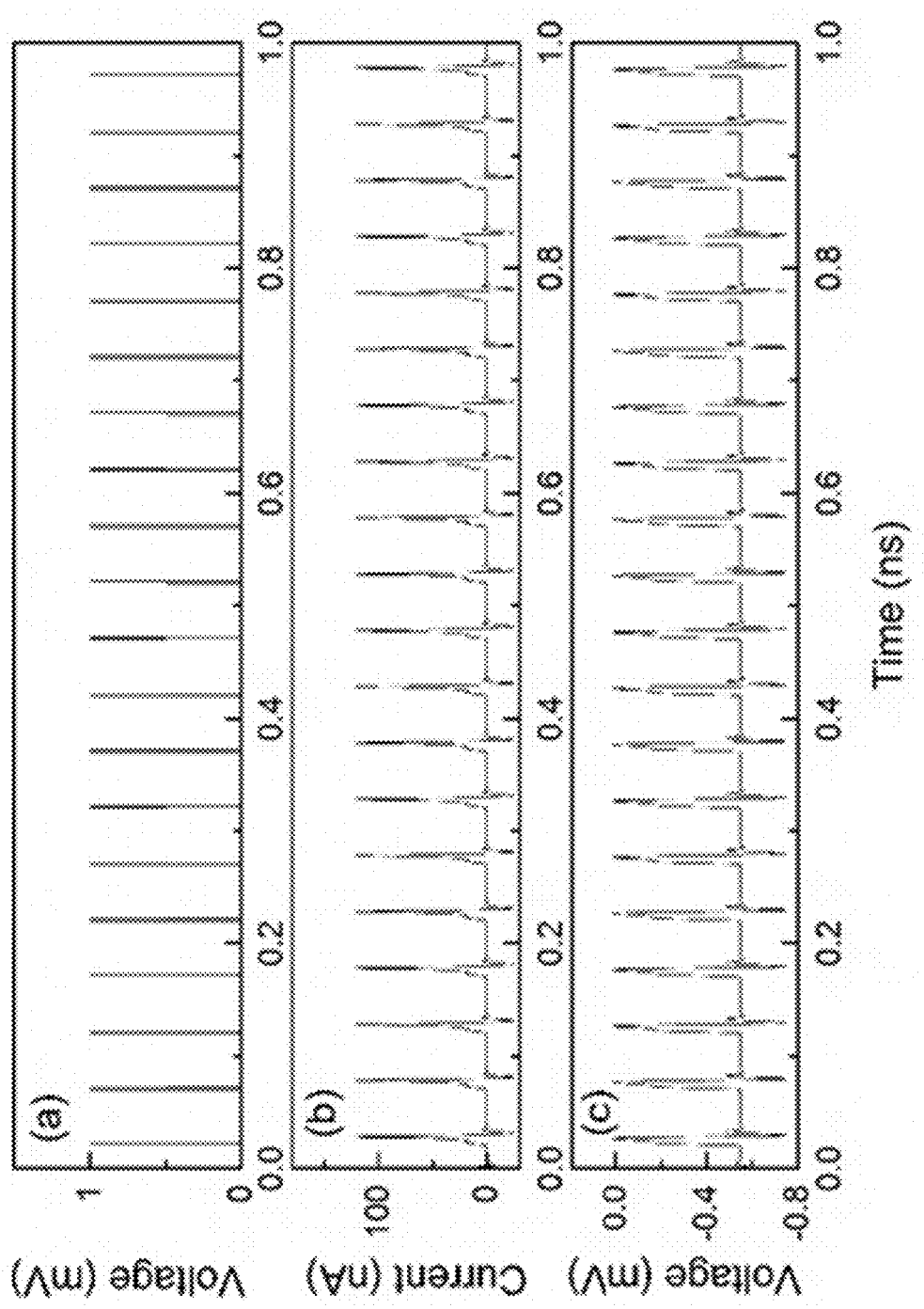
FIG. 13 shows simulation results of a QPSJ neuron circuit operated in tonic spiking mode, according to embodiments of the invention. The critical voltage of junctions $Q_1$, $Q_2$ is 0.7 mV. Capacitance C=0.23 fF, voltage bias $V_b$ is 1 mV and magnitude of input pulses $V_{in}$ is 1 mV. Panel (a): Input voltage pulses. Panel (b): Output current at node 1. Panel (c): Output voltage at node 1.

QPSJ Charge Island Based Neuron Circuit:

One implementation of the neuron circuit is a variation of charge-island circuit, which is comprised of two QPSJs and a capacitor. Instead of current propagation, the QPSJ neuron conducts cooper pairs that transport across the phase-slip center in the superconducting nanowire. When phase-slip occurs in both the junctions, the node 1 between both the QPSJs is isolated from the rest of the circuit acting as an island that can hold charge $Q = CV_C$. Both the junctions $Q_1$ and $Q_2$ are biased by DC voltage $V_b$ such that the voltage across each junction does not exceed the critical voltage $V_C$ of either junction. Bias voltage $V_b$ typically provides approximately 70% of the critical voltage for each junction and therefore is 1.4 $V_C$. The input voltage $V_{in}$ is a pulse signal that can drive the junction $Q_1$ above its critical voltage $V_C$. The capacitor works as a membrane capacitor in a neuron circuit. If the capacitance $C < 2e/V_C$, the capacitor cannot hold the charge generated by exciting $Q_1$ above its critical voltage, and therefore immediately switches the junction $Q_2$. But if the capacitance $C > 2e/V_C$, then the island keeps trapping the charge when pulses arrives until $C<Q/V_C$ and fires multiple pulses at a time, where Q is the total charges accumulated on the capacitor. Depending on the capacitance, the QPSJ neuron circuit emulates biological neuron in terms of tonic spiking and tonic bursting. If Q1 and Q2 are identical, the critical voltage of junctions is $V_C$, the magnitude of $V_{in}$ is $V_A$ and bias voltage is $V_b$. The circuit works only if $V_A+V_b>2V_C$. The circuit operates in a tonic spiking mode if $C<2e/V_C$, and it operates in a tonic bursting mode. The circuit is simulated through the WRSPICE to demonstrate the tonic spiking and tonic bursting functions as shown in FIGS. 13 and 14.

Figure 14:
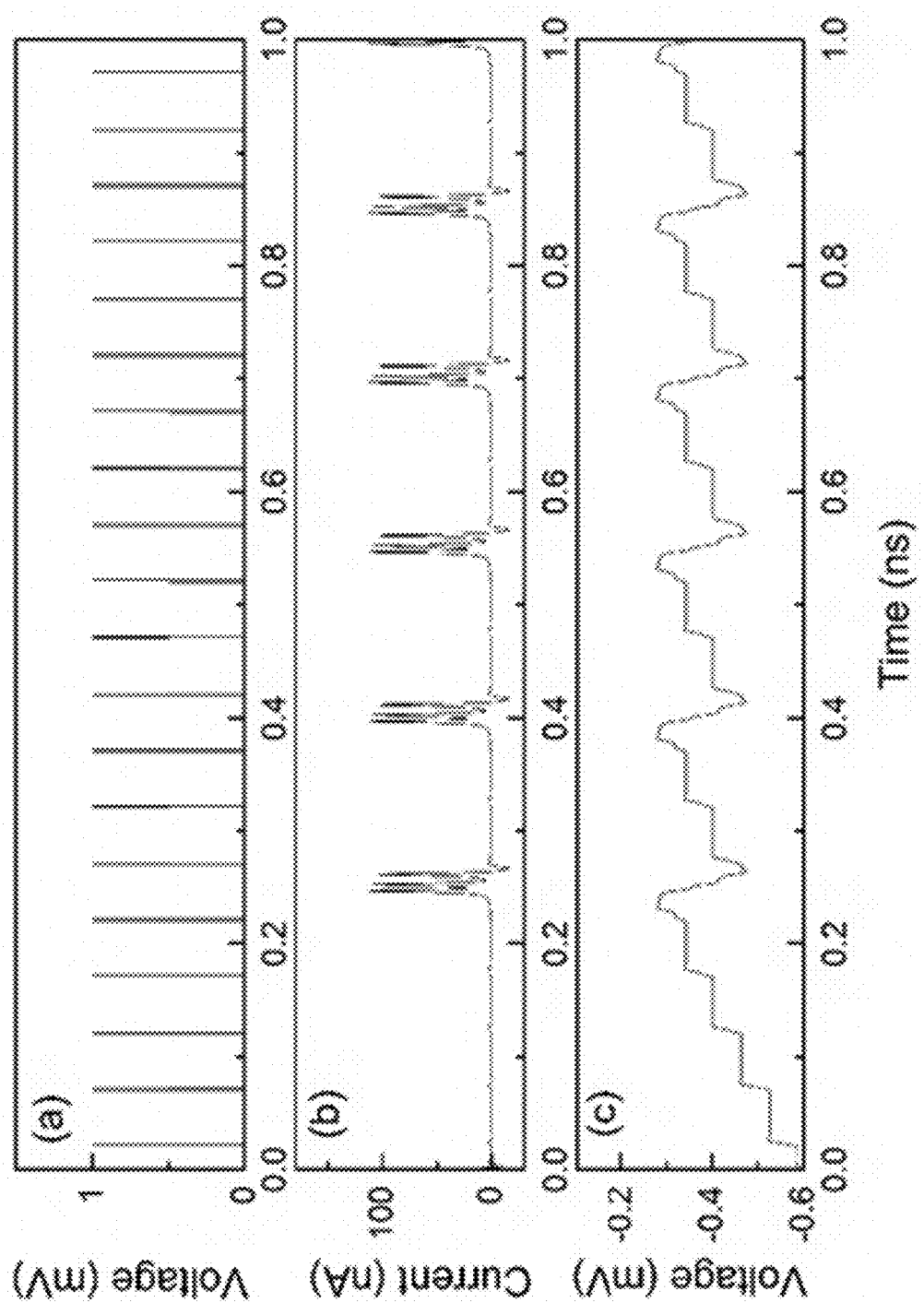
FIG. 14 shows simulation results of a QPSJ neuron circuit operated in tonic bursting mode, according to embodiments of the invention. The critical voltage of junctions $Q_1$, $Q_2$ is 0.7 mV. Capacitance C=5 fF, voltage bias $V_b$ is 1 mV and magnitude of input pulses $V_{in}$ is 1 mV. Panel (a): Input voltage pulses. Panel (b): Output current at node 1. Panel (c): Output voltage at node 1.
Figure 15:
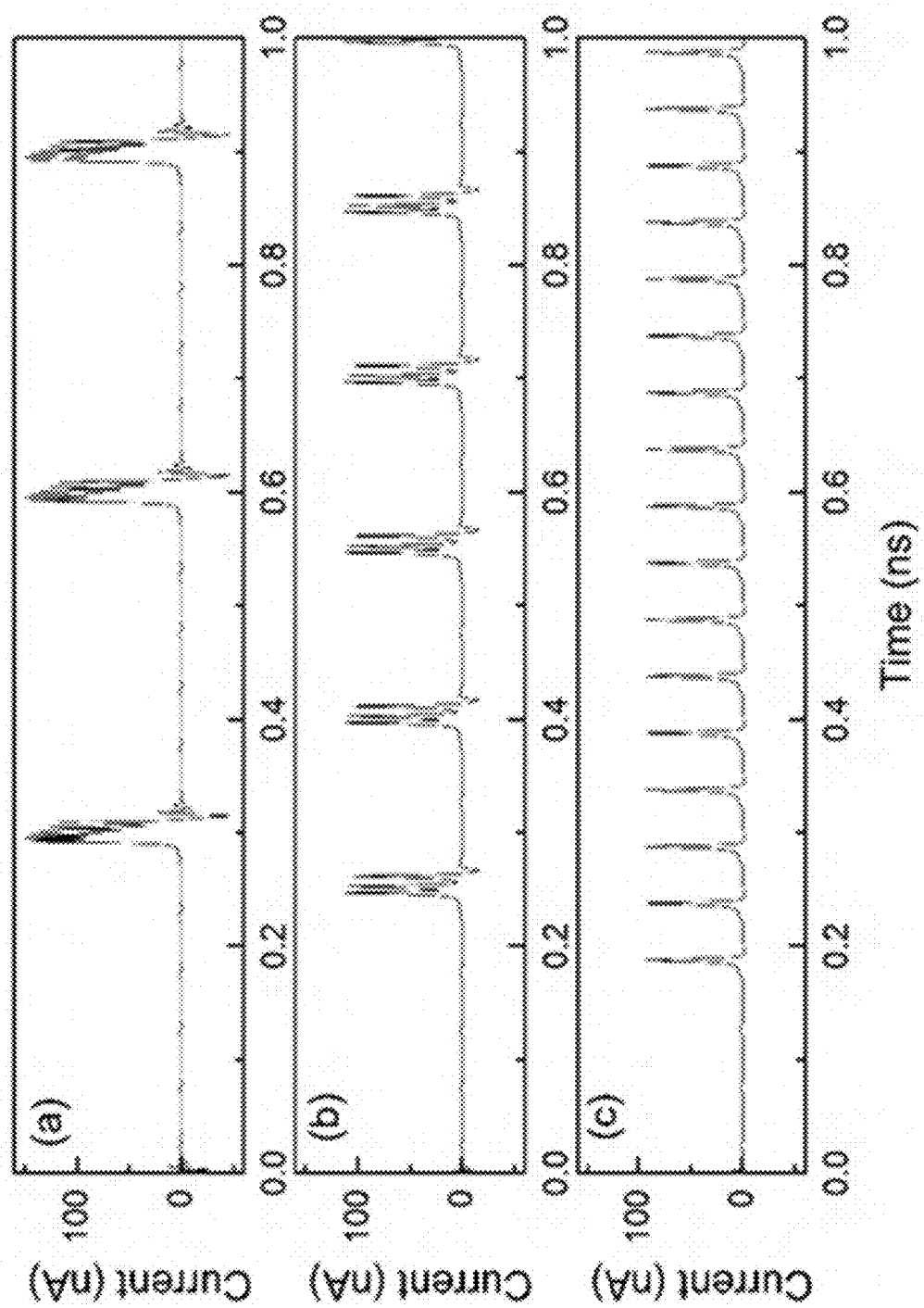
FIG. 15 shows simulation results of a QPSJ neuron output currents with different firing frequencies, according to embodiments of the invention. The critical voltage of junctions $Q_1$, $Q_2$ is 0.7 mV. Capacitance C=5 fF, voltage bias $V_b$ is 1 mV, normal resistor of $Q_1$, $Q_2$ is 1 kΩ series resistor of $Q_1$ is 12 kΩ and magnitude of input pulses $V_{in}$ is 1 mV. Panel (a): Series resistor of $Q_2$ is 4 kΩ Panel (c): Series resistor of $Q_2$ is 8 kΩ Panel (c): Series resistor of $Q_2$ is 12 kΩ.

The membrane voltage gradually drops three steps but is not fully reset since the membrane capacitor does not discharge all the charges it stores, as shown in FIG. 14. By adjusting the resistance shown in Eqn. 9, the damping parameter $\beta_D$ changes and therefore the number of electrons discharged each time changes. This can be done by adding a series resistor to adjust the firing period of a tonic bursting neuron as shown in FIG. 15.

$$\beta_D = \frac{2\pi V_C L}{2eR^2} \quad (9)$$

Figure 16:
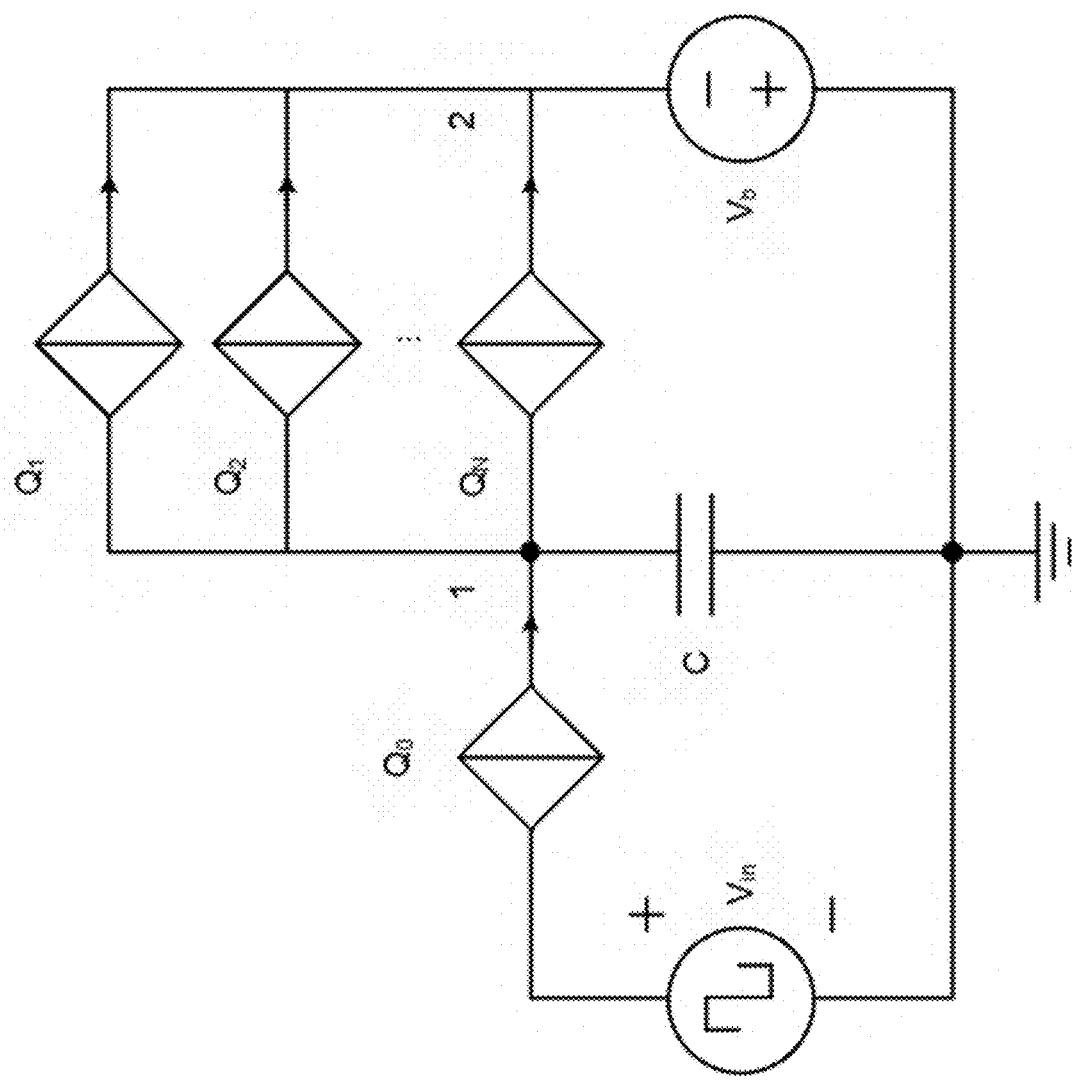
FIG. 16 shows an integrated and fire neuron circuit with integration capacitor C and multiple parallel output QPSJs, according to embodiments of the invention.
Figure 17:
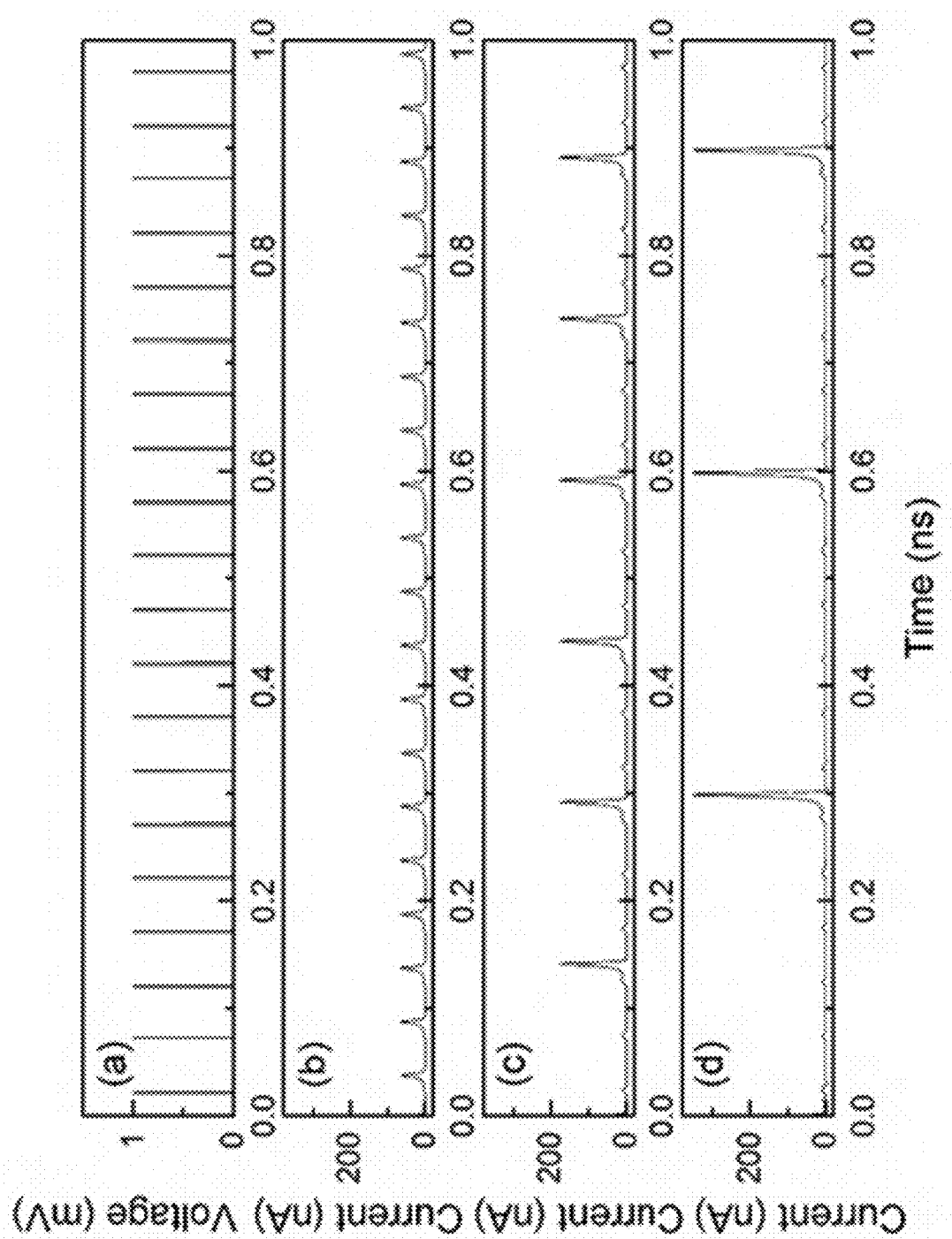
FIG. 17 shows simulation results of IFN neuron output currents with different N values, according to embodiments of the invention. The critical voltage of all junctions is 0.7 mV. Capacitance C=5 fF, voltage bias $V_b$ is 1 mV, and magnitude of input pulses $V_{in}$ is 1 mV. Panel (a): Input voltage. Panel (b): Output current when N=1. Panel (c): Output current when N=3. Panel (d): Output current when N=6.

Integrate and Fire Neuron Circuit:

An integrate and fire neuron integrates input signals and fires an action potential once the membrane voltage reaches a threshold value. The circuit shown in FIG. 16 takes advantage of the circuit discussed above and restricts one pulse for each firing event to imitate the behavior of the IFN neuron with a more flexible configuration that has tunable threshold and firing frequency. In FIG. 16, the capacitor C is selected that can store 2Ne charges and all the junctions are identical and overdamped.

$$C = \frac{2Ne}{V_C - V_b - V_1} \quad (10)$$

where e is the elementary charge, $V_C$ is the critical voltage of all junctions, $V_b$ is bias voltage and $V_1$ is the initial voltage at node 1. The number of parallel QPSJs N determines the threshold for the firing. Similar to the previous design, the first firing event occurs when the voltage at the capacitor C is large enough to switch junctions $Q_1$ to $Q_N$. A pair of electrons are then propagated to each parallel junction where a current pulse is generated. Meanwhile, the voltage at the capacitor gradually drops N steps with each step equal to 2e/C. The output current is the current that flows into node 2 that has an 2Ne area under each pulse. Since junctions $Q_1$ to $Q_N$ are identical and parallel, they are switched at the moment when voltage between node 1 and 2 is above the critical voltage so that a 2e current pulse is generated at each branch and sums up at node 2. In FIG. 17, all the simulations were done with a 50 ps periodical square pulse input and therefore the neuron firing period is N times of the source period. If the input is a random pulse sequence, the neuron circuit starts to generate pulses output when it receives as many as N pulses. The circuit only works when the capacitor is large enough, otherwise quantized charge-based current cannot be generated in each parallel QPSJ branch.

Synaptic Circuits:

In a brain, a synapse connects two neurons and determines the signal strength transmitted from a pre-synaptic neuron to a post-synaptic neuron. Similarly, a synaptic circuit should be able to adjust the connection strength between two neuron circuits. In CMOS neuromorphic systems, non-volatile memory cells are usually used to implement synaptic circuits. However, a lack of non-volatile superconducting devices/circuits made superconducting neuromorphic implementation more challenging, until the recent realization of magnetic Josephson junctions (MJJs) for this purpose. An MJJ has a tunable critical current that can control the switching threshold to function as a binary synapse or control the circulating current in a superconducting loop to function as an analog synapse. Although a corresponding tunable critical voltage of a QPSJ has not yet been theoretically or experimentally demonstrated, we were able to combine MJJs and QPSJs to realize synaptic functions, as illustrated in the following paragraphs.

Figure 18:
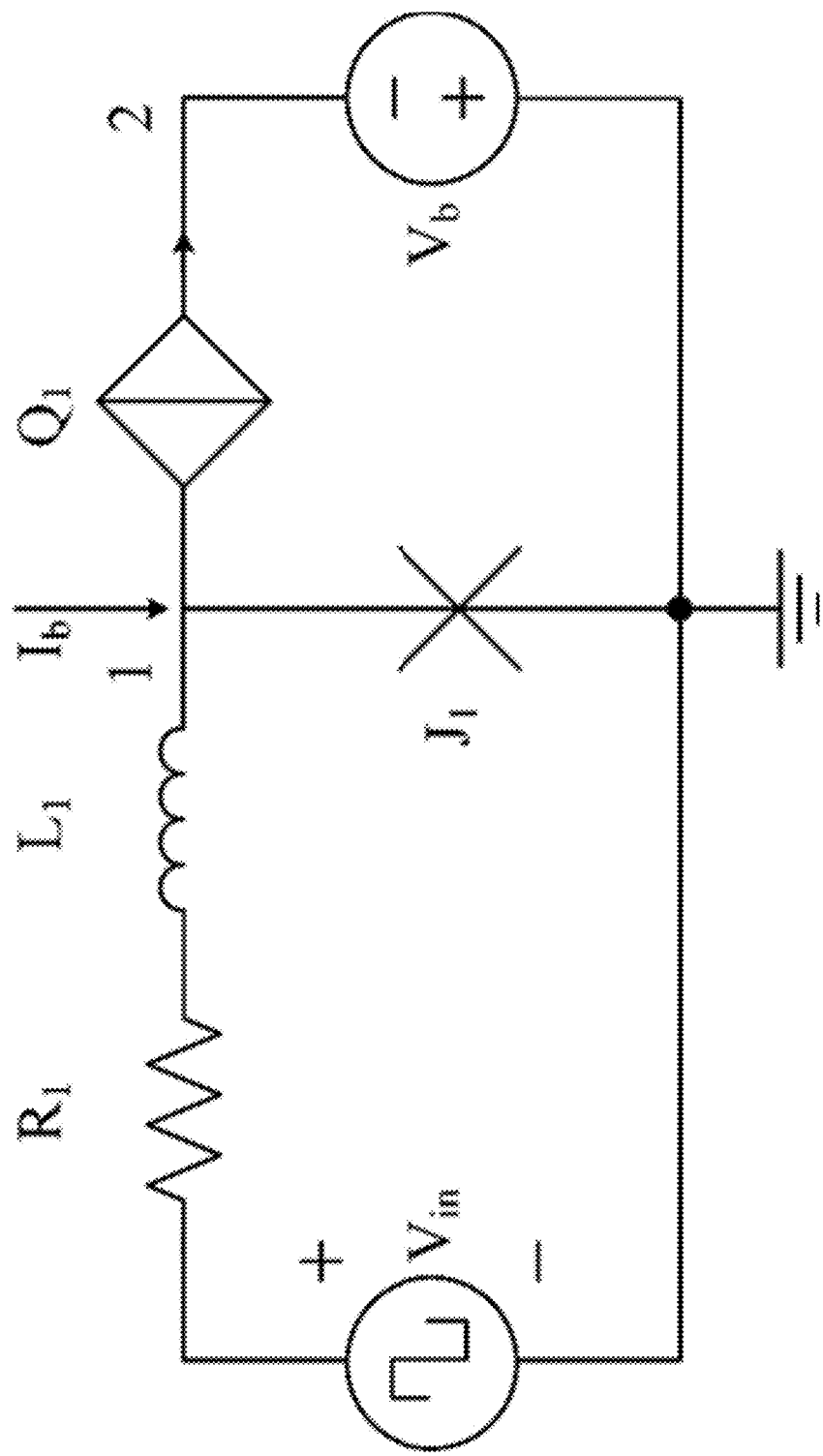
FIG. 18 shows a binary synaptic circuit based on a superconducting MJJ ($J_1$) and QPSJ ($Q_1$), according to embodiments of the invention.
Figures 19A, 19B:
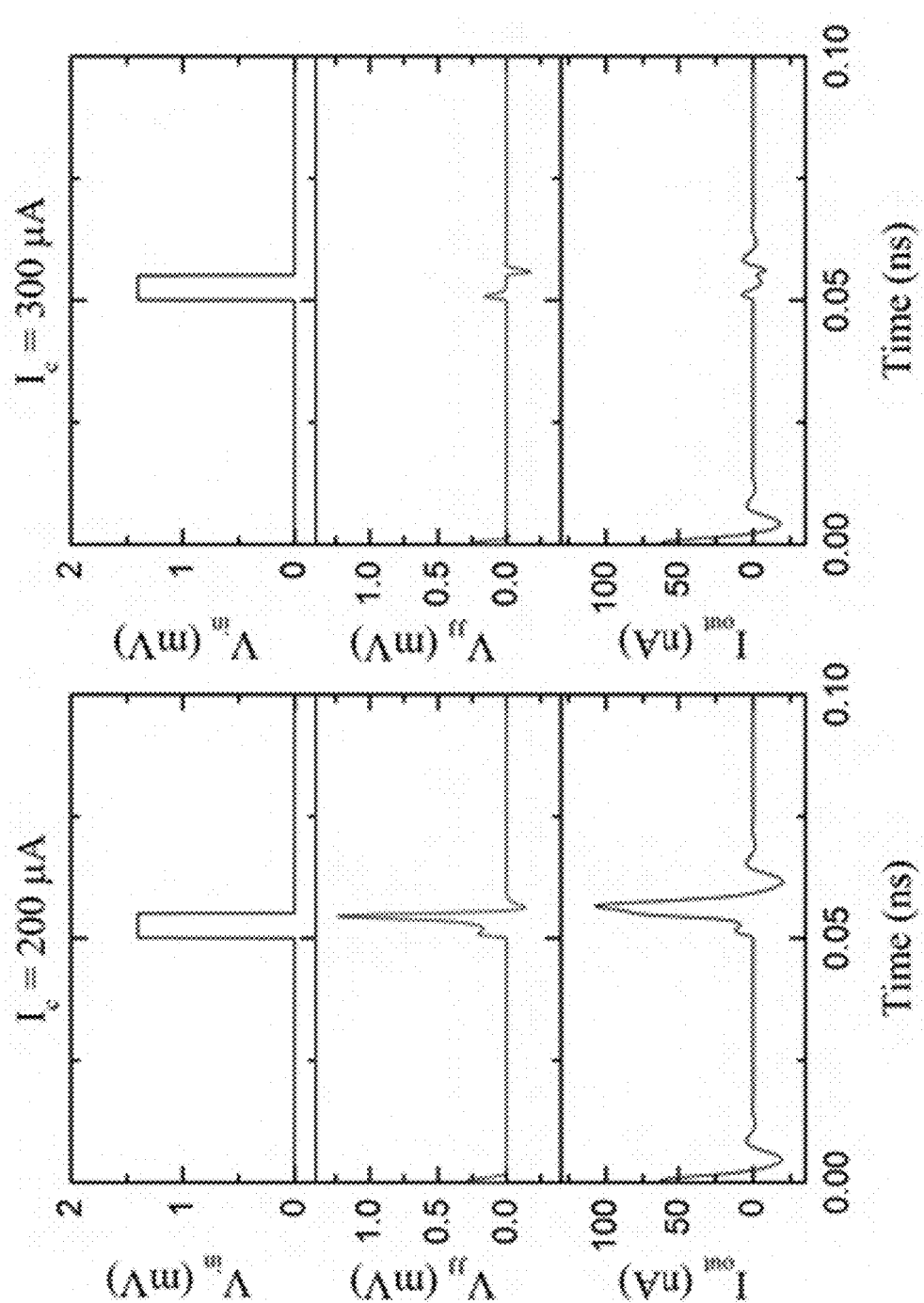
FIGS. 19A-19B show simulation results of voltage at $J_1$, voltage at $J_2$, and output current in a multi-state synaptic circuit with different $J_1$ critical current $I_c$, according to embodiments of the invention. Critical voltage of $Q_1$ is 0.7 mV, critical current of $J_1$ is 200 μA, and bias current $I_b$ is 160 μA.

A simple binary synaptic circuit using an MJJ and a QPSJ is shown in FIG. 18. Initially, MJJ $J_1$ is biased by a DC current $I_b$ while QPSJ $Q_1$ is biased by $V_b$. A short voltage pulse from input $V_{in}$, through $R_1$ and $L_1$, provides a current pulse for $J_1$. Inductor $L_1$, which can be omitted in this circuit operation, is used to trap an SFQ pulse from previous stage if there are multiple JJ stages. If $J_1$ is designed to have two distinct critical currents controlled by the magnetic order parameters, the junction can be either switched or not upon the arrival of an input current pulse. For instance, in the case of low critical current of $J_1$, the input current pulse is large enough to switch $J_1$. An SFQ pulse is generated at node 1, which can, in turn, switch $Q_1$, resulting in a current pulse at the output. However, if the critical current of $J_1$ is high, the total current injected to $J_1$ is insufficient to switch it. Voltage at node 1 stays at zero and there will be no quantized current pulses at the output. The full operation of this binary synaptic circuit is illustrated in the simulation results shown in FIGS. 19A-19B, where the critical current of $J_1$ is either 200 μA or 300 μA, to represent a weight of "1" or "0".

Figure 20:
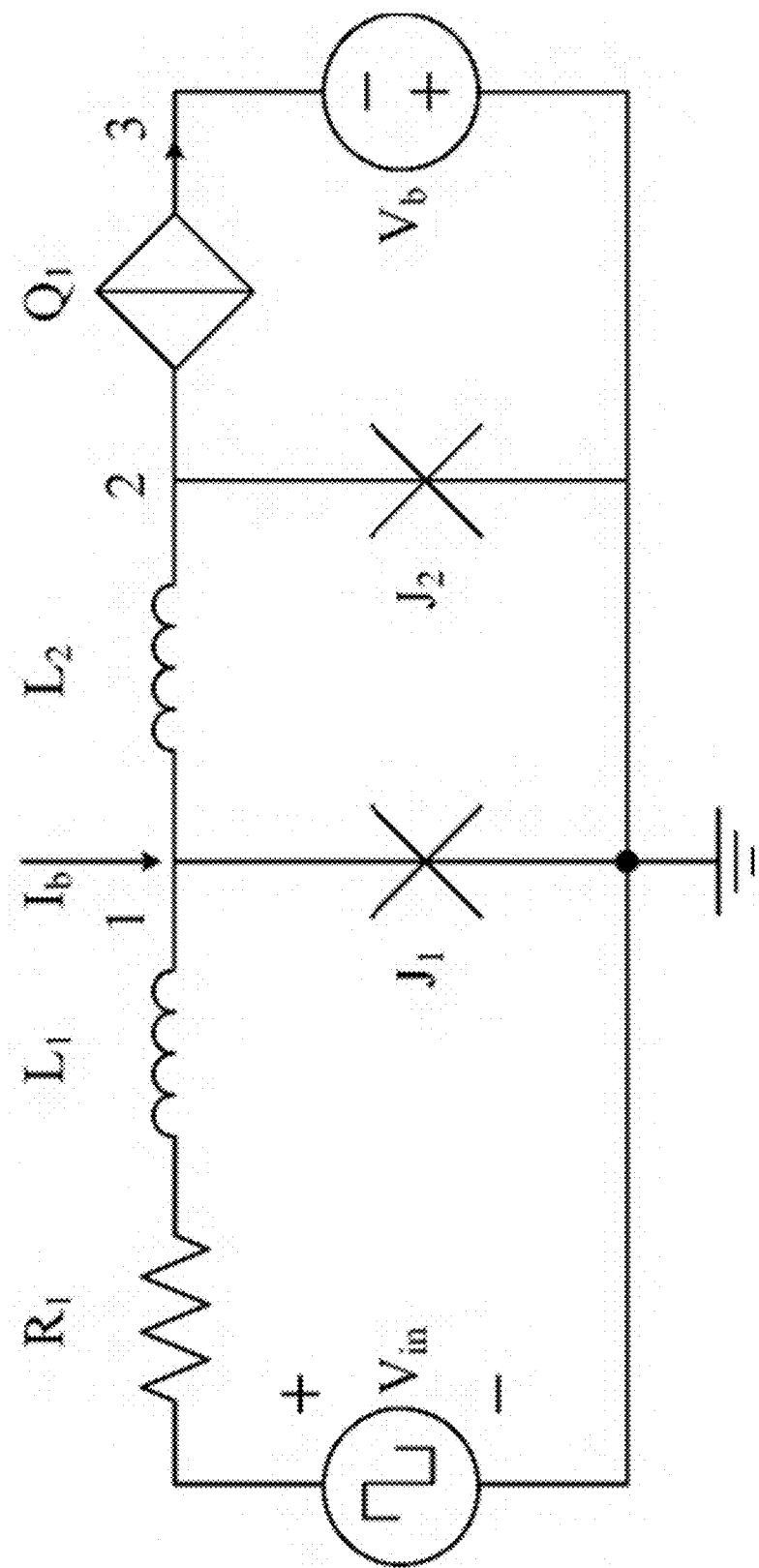
FIG. 20 shows a multi-state synaptic circuit based on a superconducting JJ ($J_1$), MJJ ($J_2$), and QPSJ ($Q_1$), according to embodiments of the invention.
Figures 21A, 21B, 21C, 21D:
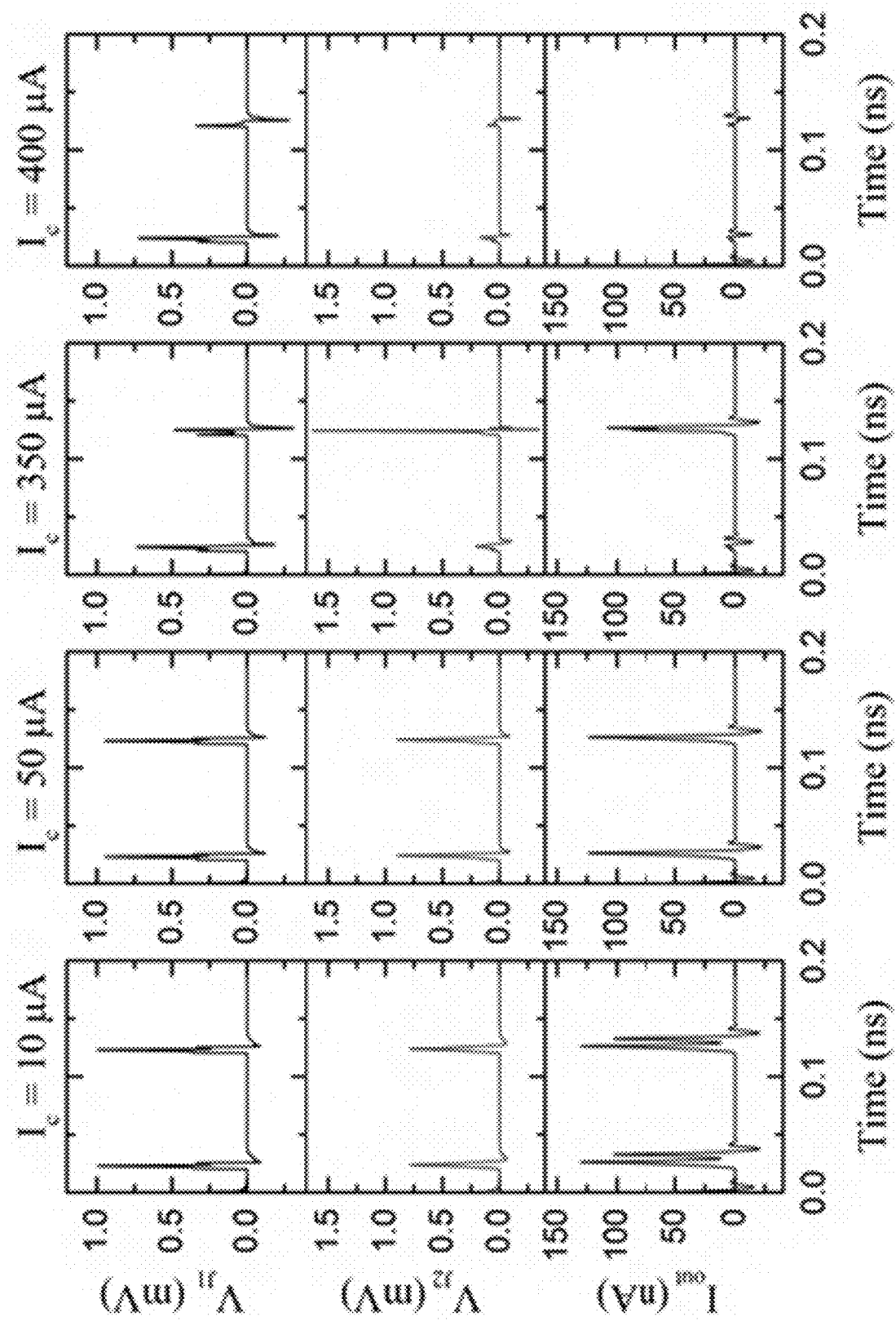
FIGS. 21A-21D show simulation results of voltage at $J_1$, voltage at $J_2$, and output current in a multi-state synaptic circuit with different $J_1$ critical current $I_c$, according to embodiments of the invention. Critical voltage of $Q_1$ is 0.7 mV, critical current of $J_1$ is 200 μA, and bias current $I_b$ is 160 μA.

In the neuromorphic system described here, signals are generated and propagated in the form of quantized charge current pulses. The multi-state synaptic circuit shown in FIG. 20 can generate multiple current pulses that contain a charge of 2Ne, depending on the state of MJJ $J_2$ Josephson junction $J_1$ is biased by $I_b$ and switched after an input current pulse from $V_{in}$. Inductor $L_2$ is chosen to store a single flux quantum, which in turn switches MJJ $J_2$ after a short delay. The resulting voltage pulse at node 2 switch $Q_1$ and generate current pulses at output. Since the magnitude of SFQ pulse at node 2 is inversely proportion to the critical current $I_c$ of $J_2$, the width of this SFQ pulse is proportion to $I_c$. As a result, more current pulses are generated when $I_c$ is low because the switching speed of $Q_1$ is fast (i.e. the normal resistance of $Q_1$ is relatively low), which allows $Q_1$ to be switched multiple times within a short time. The simulation results show that different numbers of current pulses are generated when $I_c$ varies from 10 μA to 400 μA. Although the change is not linear, this can be used to represent a synaptic weight of 2, 1, 0.5, or 0, according to the number of current pulses generated within a set time interval.

Figure 22:
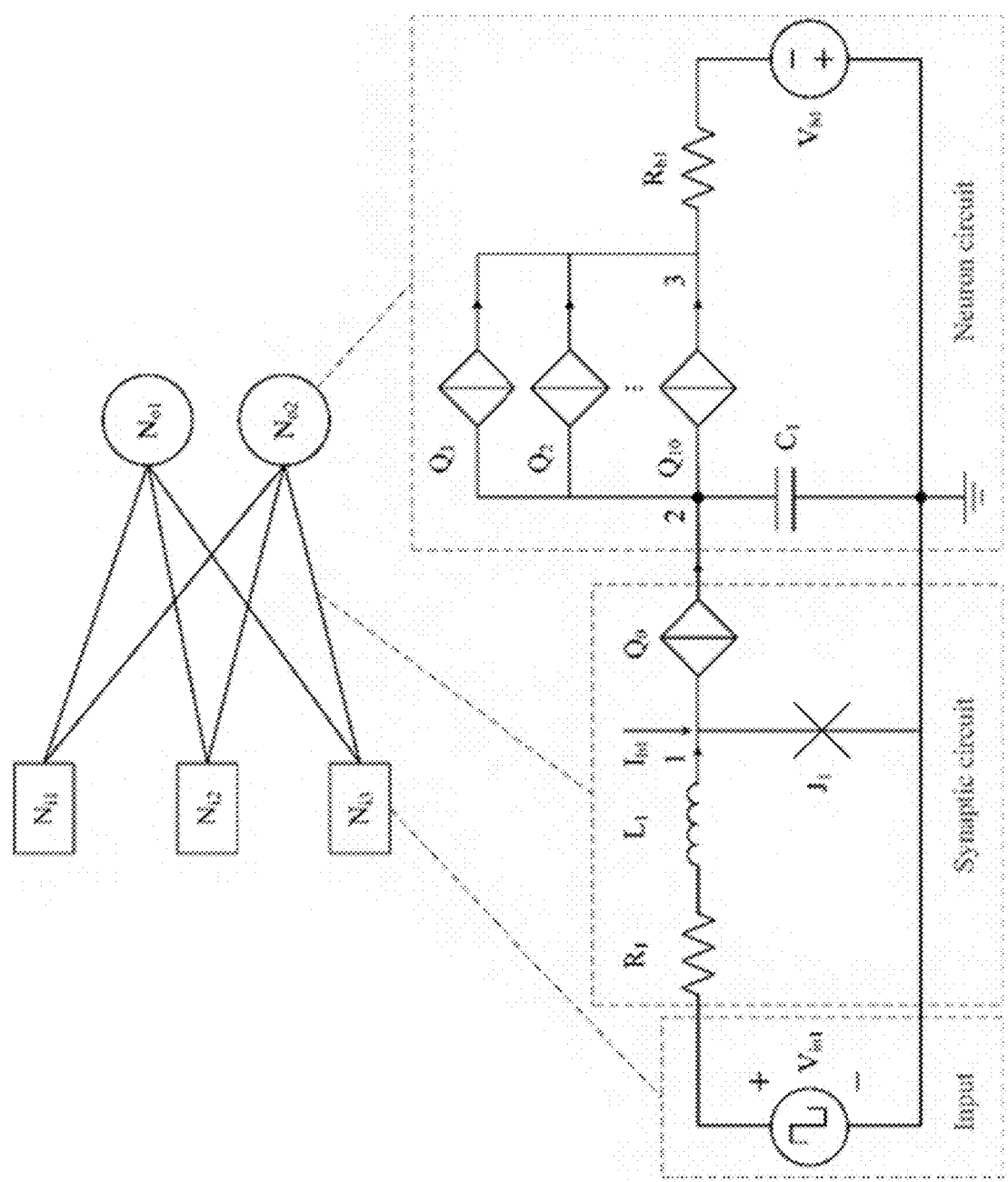
FIG. 22 shows network architecture of a 3×2 neural network based on superconducting synaptic and neuron circuits, according to embodiments of the invention. $N_{ix}$ are input neurons and $N_{oy}$ are output neurons.
Figure 23:
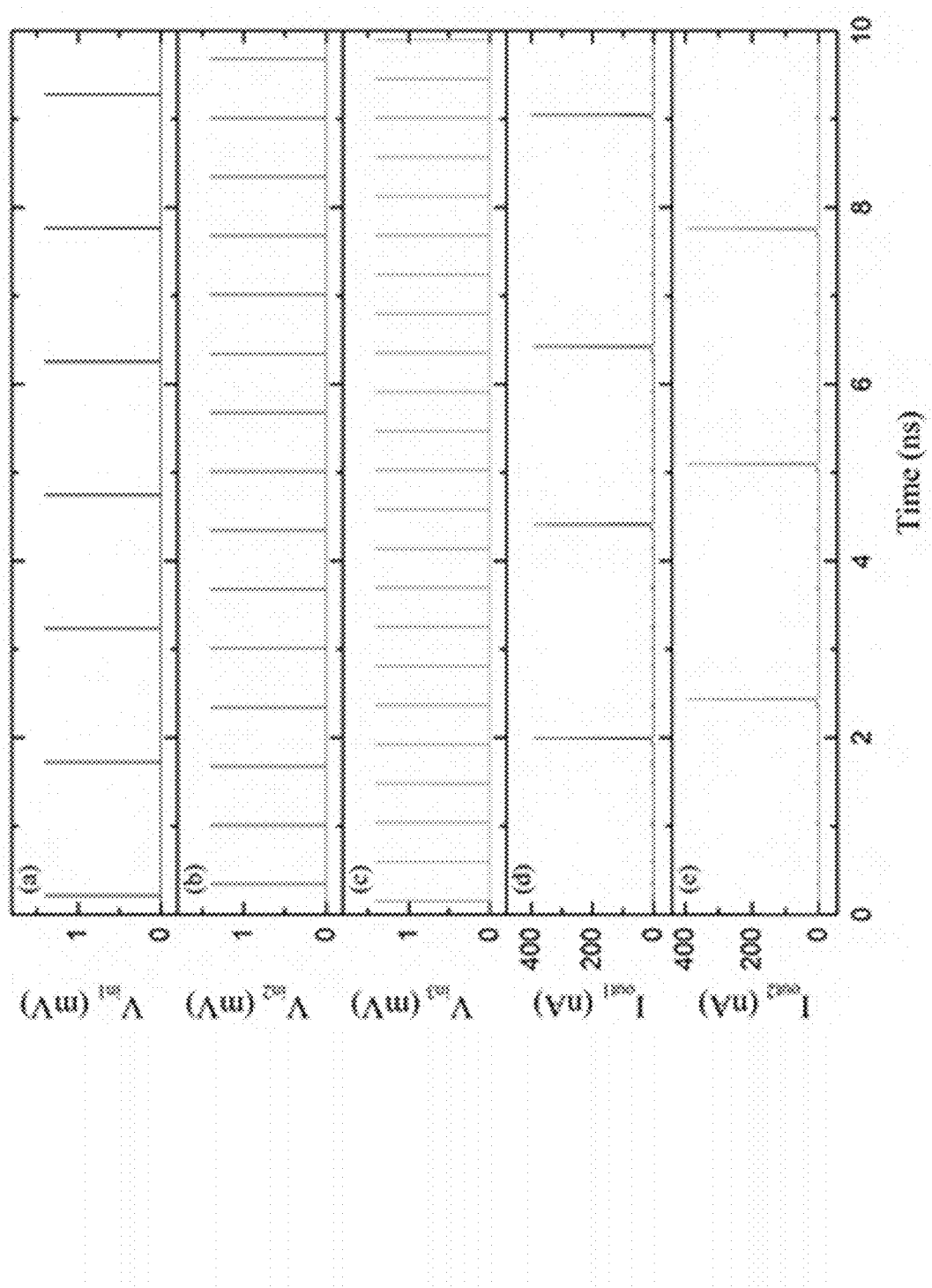
FIG. 23 shows simulation results of a 3×2 network illustrated in FIG. 11 with weight matrices [1 1 1] and [0 1 1]. Panel (a): Input voltage 1. Panel (b): Input voltage 2. Panel (c): Input voltage 3. Panel (d): Output current 1. Panel (e): Output current 2.
Figure 24:
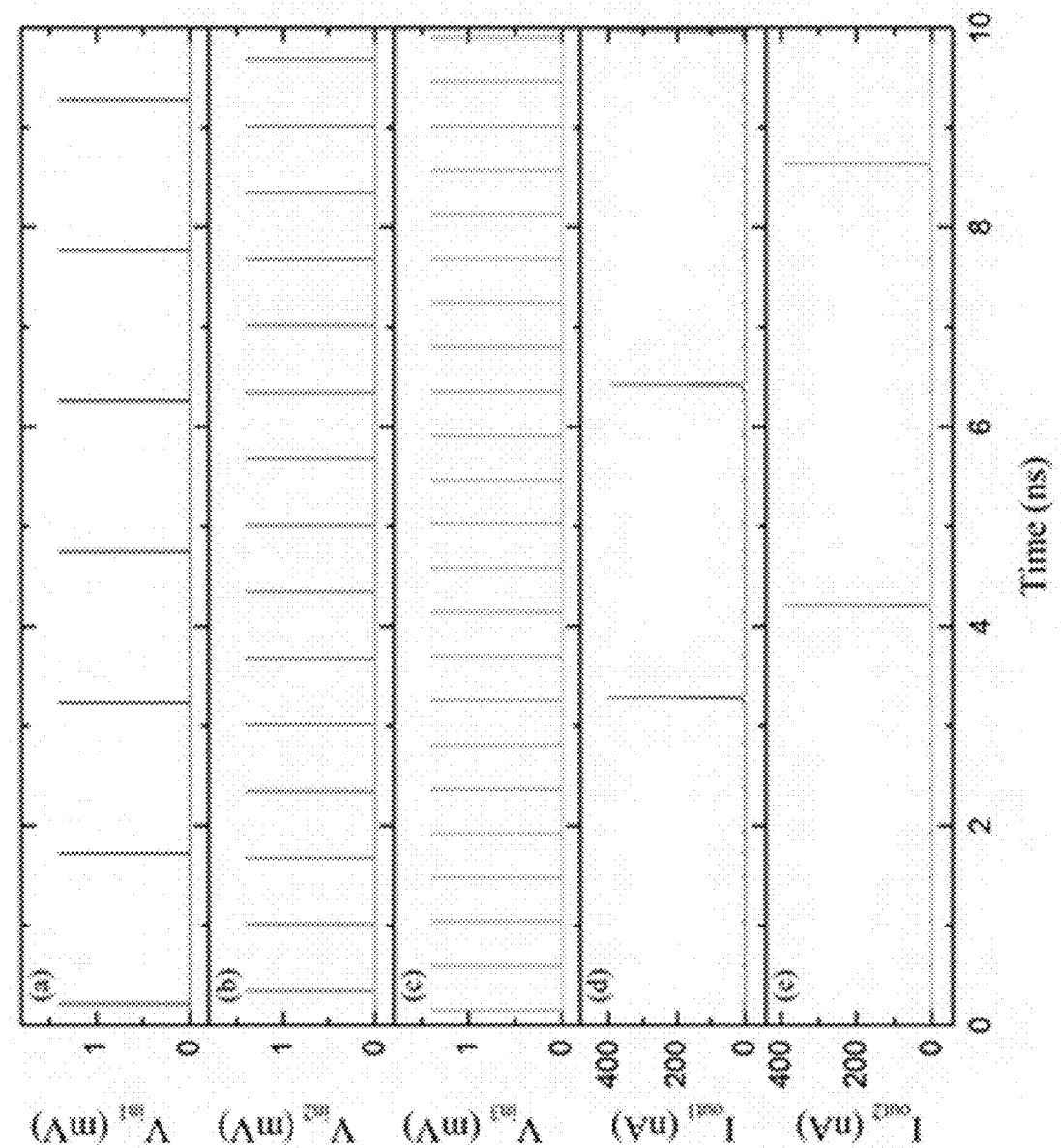
FIG. 24 shows simulation results of a 3×2 network illustrated in FIG. 11 with weight matrices [1 0 1] and [0 0 1]. Panel (a): Input voltage 1. Panel (b): Input voltage 2. Panel (c): Input voltage 3. Panel (d): Output current 1. Panel (e): Output current 2.

Neural Network Simulation:

To verify the functions of our neuron and synaptic circuits and demonstrate extension to more complex circuits, we combined neuron and synaptic circuits and simulated a neural network. A basic 3×2 network architecture is shown in FIG. 22, for simplicity. We simulated the 3×2 network consisting of three voltage sources and two neuron circuits connected by six binary synaptic circuits. Voltage sources provide input pulses with different frequencies, which represent three different external signals or signals from upstream neurons. The output neuron fires a pulse/spike as soon as it receives a set number (in this case 10) of quantized current pulses from the three synaptic circuits, as the threshold is set to 10. The simulation was conducted with different initial values of each synaptic weight (i.e. critical current of $J_1$), that reflected different firing frequencies observed for each output neuron. Weight matrices for neuron 1 and neuron 2 were [1 1 1] and [0 1 1], respectively, in FIG. 23, and were [1 0 1] and [0 0 1], respectively, in FIG. 24. The results show that pulses from a weight "1" synapse is counted while those from a weight "0" are not counted, and the neuron fires immediately after the number of total pulses received reaches the threshold (=10 here). As a result, this circuit works similar to a digital neuromorphic circuit.

The foregoing description of the exemplary embodiments of the present invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference.

LISTING OF REFERENCES

[1] Holmes, D. S., Ripple, A. L., and Manheimer, M. A. "Energy-efficient superconducting computing power budgets and requirements," *IEEE Transactions on Applied Superconductivity*, vol. 23, no. 3, pp. 1 701 610-1 701 610, 2013.

[2] Manheimer, Marc A. "Cryogenic computing complexity program: Phase 1 introduction." *IEEE Transactions on Applied Superconductivity* 25.3 (2015): 1-4.

[3] Likharev, K. K., 0. A. Mukhanov, and V. K. Semenov. "Resistive single flux quantum logic for the Josephson-junction digital technology." SQUID'85. Walter de Gruyter, Berlin, 1985.

[4] Likharev, Konstantin K., and Vasilii K. Semenov. "RSFQ logic/memory family: A new Josephson-junction technology for sub-terahertz-clock-frequency digital systems." *IEEE Transactions on Applied Superconductivity* 1.1 (1991): 3-28.

[5] Herr, Quentin P., et al. "Ultra-low-power superconductor logic." *Journal of applied physics* 109.10 (2011): 103903.

[6] Mukhanov, Oleg A. "Energy-efficient single flux quantum technology." *IEEE Transactions on Applied Superconductivity* 21.3 (2011): 760-769.

[7] Takeuchi, Naoki, et al. "An adiabatic quantum flux parametron as an ultra-low-power logic device." *Superconductor Science and Technology* 26.3 (2013): 035010.

[8] Hosoya, Mutsumi, et al. "Quantum flux parametron: A single quantum flux device for Josephson supercomputer." *IEEE Transactions on Applied Superconductivity* 1.2 (1991): 77-89.

[9] Landauer, Rolf "Irreversibility and heat generation in the computing process." *IBM journal of research and development* 5.3 (1961): 183-191.

[10] Takeuchi, N., Y. Yamanashi, and N. Yoshikawa. "Reversible logic gate using adiabatic superconducting devices." *Scientific reports* 4 (2014): 6354.

[11] Semenov, Vasili K., George V. Danilov, and Dmitri V. Averin. "Classical and quantum operation modes of the reversible Josephson-junction logic circuits." *IEEE Transactions on Applied Superconductivity* 17.2 (2007): 455-461.

[12] Wustmann, Waltraut, and Kevin D. Osborn. "Reversible fluxon logic: Topological particles allow gates beyond the standard adiabatic limit." arXiv preprint arXiv:1711.04339 (2017).

[13] Osborn, Kevin D. "Reversible computation with flux solitons." U.S. Pat. No. 9,812,836. 7 Nov. 2017.

[14] Mooij, J. E., and Yu V. Nazarov. "Superconducting nanowires as quantum phase-slip junctions." *Nature Physics* 2.3 (2006): 169.

[15] Mooij, J. E., et al. "Superconductorinsulator transition in nanowires and nanowire arrays." *New Journal of Physics* 17.3 (2015): 033006.

[16] Astafiev, O. V., et al. "Coherent quantum phase slip." *Nature* 484.7394 (2012): 355.

[17] Webster, C. H., et al. "Nbsi nanowire quantum phase-slip circuits: dc supercurrent blockade, microwave measurements, and thermal analysis." *Physical Review B* 87.14 (2013): 144510.

[18] Goteti, Uday S., and Michael C. Hamilton. "Charge-based superconducting digital logic family using quantum phase-slip junctions." *IEEE Transactions on Applied Superconductivity* 28.4 (2018): 1-4.

[19] Cheng, Ran, Uday S. Goteti, and Michael C. Hamilton. "Spiking neuron circuits using superconducting quantum phase-slip junctions." *Journal of Applied Physics* 124.15 (2018): 152126.

[20] Cheng, Ran, Uday S. Goteti, and Michael C. Hamilton. "Superconducting neuromorphic computing using quantum phase-slip junctions." *IEEE Transactions on Applied Superconductivity* 29.5 (2019): 1-5.

[21] Goteti, Uday Sravan, and Michael C. Hamilton. "Complementary quantum logic family using Josephson junctions and quantum phase-slip junctions." *IEEE Transactions on Applied Superconductivity* 29.5 (2019): 1-6.

[22] Goteti, Uday Sravan. "Superconducting Digital Logic Families Using Quantum Phase-slip Junctions." *PhD Dissertation* (2019), Auburn University.

[23] Goteti, Uday Sravan, and Michael C. Hamilton. "SPICE model implementation of quantum phase-slip junctions." *Electronics Letters* 51.13 (2015): 979-981.

[24] Hioe, Willy, M. Hosoya, and E. Goto. "A new quantum flux parametron logic gate with large input margin." *IEEE Transactions on Magnetics* 27.2 (1991): 2765-2768.

[25] Goto, Eiichi. "The parametron, a digital computing element which utilizes parametric oscillation," *Proceedings of the IRE* 47.8 (1959): 1304-1316,

[26] Mead, Carver. "Neuromorphic electronic systems." *Proceedings of the IEEE* 78.10 (1990): 1629-1636.

[27] Linares-Barranco, Bernabe, et al. "On spike-timing-dependent-plasticity, memristive devices, and building a self-learning visual cortex." *Frontiers in neuroscience* 5 (2011): 26.

[28] Seo, Jae-sun, et al. "A 45 nm CMOS neuromorphic chip with a scalable architecture for learning in networks of spiking neurons." *Custom Integrated Circuits Conference (CICO)*, 2011 IEEE. IEE, 2011.

[29] Rajendran, Bipin, and Fabien Alibart. "Neuromorphic computing based on emerging memory technologies." *IEEE Journal on Emerging and Selected Topics in Circuits and Systems* 6.2 (2016): 198-211,

[30] Sidler, Severin, et al. "Unsupervised Learning Using Phase-Change Synapses and Complementary Patterns," *International Conference on Artificial Neural Networks*, Springer, Cham, 2017.

[31] Davies, Mike, et al. "Loihi: A neuromorphic manycore processor with on-chip learning," *IEEE Micro* 38.1 (2018): 82-99.

[32] Bell, C., et al. "Controllable Josephson current through a pseudospin-valve structure." *Applied physics letters* 84.7 (2004): 1153-1155.

[33] Ryazanov, Valery V., et al. "Magnetic Josephson junction technology for digital and memory applications," *Physics Procedia* 36 (2012): 3:5-41.

[34] Russek, Stephen E., et al. "Stochastic single flux quantum neuromorphic computing using magnetically tunable Josephson junctions," *Rebooting Computing (ICRC), IEEE International Conference on*. IEEE; 2016.

[35] Schneider, Michael L., et al. "Energy-Efficient Single-Flux-Quantum Based Neuromorphic Computing." *Rebooting Computing (ICRC)*, 2017 *IEEE International Conference on*. IEEE, 2017.

[36] Schneider, Michael L., et al. "Ultralow power artificial synapses using nanotextured magnetic Josephson junctions." *Science advances* 4.1 (2018): e1701329.

[37] Shainline, Jeffrey M., et al. "Superconducting optoelectronic circuits for neuromorphic computing." *Physical Review Applied* 7.3 (2017): 034013.

[38] U. S. Goteti and M. C. Hamilton, "*Charge-Based Superconducting Digital Logic Family Using Quantum Phase-Slip Junctions*," in IEEE Transactions on Applied Superconductivity, vol. 28, no. 4, pp. 1-4. June 2018, doi: 10.1109/TASC.2018.2803123

[39] Izhikevich, Eugene M. "Which model to use for cortical spiking neurons?." *IEEE transactions on neural networks* 15.5 (2004): 1063-1070.

[40] Jeong, Doo Seok, and Cheol Seong Hwang. "Nonvolatile Memory Materials for Neuromorphic Intelligent Machines," *Advanced Materials* (2018): 1704729.

What is claimed is:

1. A quantum charge parametron, comprising:
a load capacitor;
two quantum phase-slip junctions (QPSJs) coupled to each other through the load capacitor so as to define two charge islands, each charge island being located between the load capacitor and a respective one of the two QPSJs;
at least one input voltage source coupled to the two QPSJs so that the two QPSJs, the load capacitor and the at least one input voltage source define a loop; and
an excitation voltage source coupled to the two charge islands.

2. The quantum charge parametron of claim 1, further comprising:
a first capacitor and a second capacitor, each of the first and second capacitors coupled between the excitation voltage source and a respective one of the two charge islands.

3. The quantum charge parametron of claim 2, wherein a potential energy of the quantum charge parametron is determined by $$U_{QCP} = E_S \left[ \frac{(q_{ex} - q_-)^2}{\beta_L} + \frac{(q_{in} - q_+)^2}{\beta_L + 2\beta_q} - 2\cos(q_-)\cos(q_+) \right]$$

wherein $$\beta_L = 2C_1 V_C \left( \frac{2\pi}{2e} \right),$$

$$\beta_q = 2C_q V_C \left( \frac{2\pi}{2e} \right),$$

$$q_+ = \frac{q_1 + q_2}{2},$$

$$q_- = \frac{q_1 - q_2}{2},$$

wherein $q_{in}$ is a normalized input charge, $q_{ex}$ is a normalized excitation charge, $E_s$ is a phase-slip energy of either of the two QPSJs, $V_C$ is a critical voltage of either of the two QPSJs, $C_q$ is a capacitance of the load capacitor, $C_1$ is a capacitance of the first capacitor, and $q_1$ and $q_2$ are the charges at two charge islands respectively, normalized to $2\pi/2e$.

4. The quantum charge parametron of claim 3, wherein the capacitances $C_1$, $C_2$ and $C_q$ are adjusted to enable the quantum charge parametron to operate at a switching energy in the order of thermal energy $k_B T$ or lower at a given temperature, when a predetermined excitation voltage source frequency is chosen.

5. The quantum charge parametron of claim 3, wherein the potential energy as a function of the normalized output charge $q_{out}$ is characterized with a double potential well that is formed corresponding to two current directions, thereby defining two logic states of the quantum charge parametron, wherein an energy barrier between the potential wells determines energy consumption of switching from one logic state to another logic state.

6. The quantum charge parametron of claim 5, wherein the capacitance $C_q$ of the load capacitor is adjusted to make the parameter $\beta_L = 1$, such that the energy barrier is lowered to zero, thereby, enabling adiabatic switching between the two logic states.

7. The quantum charge parametron of claim 5, wherein switching between the two logic states depends on a polarity of an input voltage from the at least one input voltage source, and wherein the input voltage is in the order of $0.1 V_C$ or lower to perform switching operation.

8. The quantum charge parametron of claim 1, wherein for each charge island, when a quantized charge of a Cooper electron pair tunnels across the respective QPSJ that defines said charge island, the quantized charge of the Cooper electron pair is stored in said charge island, otherwise no quantized charge of the Cooper electron pair is stored in said charge island, wherein the presence and absence of the quantized charge in said charge island form two logic states of a basic logic element.

9. The quantum charge parametron of claim 8, wherein the quantized charge is obtained by switching either of the two QPSJs to produce a current pulse, corresponding to the charge of a Cooper electron pair, when excited by an input voltage from the at least one input voltage source and an excitation voltage from the excitation voltage source.

10. The quantum charge parametron of claim 8, wherein two ground states are represented by the presence of the quantized charge at either of the two charge islands.

11. The quantum charge parametron of claim 8, wherein switching of the quantized charge between the two charge islands is triggered by the polarity of a DC input voltage from the at least one input voltage source, with positive polarity corresponding to the quantized charge at one of the two charge islands and negative polarity corresponding to the quantized charge at the other charge island, wherein said switching occurs when the critical voltage of one of the two QPSJs is exceeded by a potential difference developed across said QPSJ due to the input and excitation voltage sources.

12. The quantum charge parametron of claim 8, wherein depending on the input voltage polarity, the input and excitation voltage sources act together at one of the two charge islands and against each other at the other charge island.

13. The quantum charge parametron of claim 1, wherein at least one input voltage source comprises first, second and third input voltage sources coupled to the two QPSJs in series.

14. The quantum charge parametron of claim 13, wherein by fixing one of the first, second and third input voltages in one polarity and changing the polarity of the other input voltages, an universal logic gate of NOR or NAND is operably implemented in the form of a majority gate operation.

15. A superconducting logic cell, comprising at least one quantum charge parametron of claim 1.

16. A quantum charge parametron, comprising:
two quantum phase-slip junctions (QPSJs);
two charge islands coupled to each other through a load capacitor and isolated from the rest of the quantum charge parametron through the two QPSJs;
at least one input voltage source coupled to the two QPSJs in series; and
an excitation voltage source coupled to the two islands.

17. The quantum charge parametron of claim 16, wherein the excitation voltage source is coupled to the two islands through first and second capacitors.

18. The quantum charge parametron of claim 16, wherein for each charge island, when a quantized charge of a Cooper electron pair tunnels across the respective QPSJ that defines said charge island, the quantized charge of the Cooper electron pair is stored in said charge island, otherwise no quantized charge of the Cooper electron pair is stored in said charge island, wherein the presence and absence of the quantized charge in said charge island form two logic states of a basic logic element.

19. The quantum charge parametron of claim 18, wherein the quantized charge is obtained by switching either of the two QPSJs to produce a current pulse, corresponding to the charge of a Cooper electron pair, when excited by an input voltage from the at least one input voltage source and an excitation voltage from the excitation voltage source.

20. The quantum charge parametron of claim 18, wherein two ground states are represented by the presence of the quantized charge at either of the two charge islands.

21. The quantum charge parametron of claim 18, wherein switching of the quantized charge between the two charge islands is triggered by the polarity of a DC input voltage from the at least one input voltage source, with positive polarity corresponding to the quantized charge at one of the two charge islands and negative polarity corresponding to the quantized charge at the other charge island, wherein said switching occurs when the critical voltage of one of the two QPSJs is exceeded by a potential difference developed across said QPSJ due to the input and excitation voltage sources.

22. The quantum charge parametron of claim 18, wherein depending on the input voltage polarity, the input and excitation voltage sources act together at one of the two charge islands and against each other at the other charge island.

23. The quantum charge parametron of claim 16, wherein at least one input voltage source comprises first, second and third input voltage sources coupled to the two QPSJs in series.

24. The quantum charge parametron of claim 23, wherein by fixing one of the first, second and third input voltages in one polarity and changing the polarity of the other input voltages, an universal logic gate of NOR or NAND is operably implemented in the form of a majority gate operation.

25. A superconducting logic cell, comprising at least one quantum charge parametron of claim 16.

26. A circuitry, comprising:
a plurality of quantum charge parametrons (QCPs) coupled to each other, each QCP having an input and an output, wherein an output signal from the output of one QCP is used as an input signal to the input of another QCP to drive the another QCP.

27. The circuitry of claim 26, wherein each QCP comprises:
two quantum phase-slip junctions (QPSJs);
two charge islands coupled to each other through a load capacitor and isolated from the rest of said QCP through the two QPSJs; and
an excitation voltage source coupled to the two islands, wherein the input is connected between the two QPSJs so that the input, the two QPSJs and the load capacitor define a loop, and the output is read across the load capacitor.

28. The circuitry of claim 27, wherein the input of the first QCP of the plurality of QCPs comprises at least one input voltage source.

29. The circuitry of claim 28, wherein each QCP further comprises a first capacitor and a second capacitor, each of the first and second capacitors coupled between the excitation voltage source and a respective one of the two charge islands.

* * * * *